(12) United States Patent
Garrod

(10) Patent No.: US 11,398,239 B1
(45) Date of Patent: *Jul. 26, 2022

(54) ASR-ENHANCED SPEECH COMPRESSION

(71) Applicant: Medallia, Inc., San Francisco, CA (US)

(72) Inventor: David Garrod, Leadville, CO (US)

(73) Assignee: Medallia, Inc., San Francisco, CA (US)

( * ) Notice: Subject to any disclaimer, the term of this patent is extended or adjusted under 35 U.S.C. 154(b) by 9 days.

This patent is subject to a terminal disclaimer.

(21) Appl. No.: 17/109,445

(22) Filed: Dec. 2, 2020

Related U.S. Application Data

(63) Continuation of application No. 16/371,014, filed on Mar. 31, 2019, now Pat. No. 10,872,615.

(51) Int. Cl.
| | | |
|---|---|---|
| *G10L 19/04* | (2013.01) | |
| *G10L 15/18* | (2013.01) | |
| *H03M 7/30* | (2006.01) | |
| *G06F 40/279* | (2020.01) | |
| *G06F 17/18* | (2006.01) | |

(52) U.S. Cl.
CPC .............. *G10L 19/04* (2013.01); *G06F 17/18* (2013.01); *G06F 40/279* (2020.01); *G10L 15/18* (2013.01); *H03M 7/60* (2013.01)

(58) Field of Classification Search
CPC .............................. G10L 15/00; G10L 19/00
See application file for complete search history.

(56) References Cited

U.S. PATENT DOCUMENTS

| | | | | |
|---|---|---|---|---|
| 5,293,450 A | * | 3/1994 | Kane | ................... G10L 19/0204 |
| | | | | 704/226 |
| 5,566,272 A | | 10/1996 | Brems | |
| 5,627,939 A | | 5/1997 | Huang | |
| 5,758,256 A | * | 5/1998 | Berry | ................... H04W 88/181 |
| | | | | 455/72 |
| 5,870,397 A | * | 2/1999 | Chauffour | ............. G10L 19/012 |
| | | | | 704/E19.006 |
| 6,151,576 A | * | 11/2000 | Warnock | ................. G10L 15/26 |
| | | | | 704/235 |
| 6,336,090 B1 | | 1/2002 | Chou | |
| 6,603,921 B1 | * | 8/2003 | Kanevsky | ............. H04N 9/8042 |
| | | | | 386/253 |
| 6,785,650 B2 | | 8/2004 | Basson et al. | |
| 7,035,794 B2 | | 4/2006 | Sirivara | |

(Continued)

FOREIGN PATENT DOCUMENTS

| | | |
|---|---|---|
| KR | 1020180057446 A | 5/2018 |
| KR | 1020180092582 A | 8/2018 |

OTHER PUBLICATIONS

Singh, S., Assaf, M. H., & Kumar, A. (2016). A Novel Algorithm of Sparse Representations for Speech Compression/Enhancement and Its Application in Speaker Recognition System. International Journal of Computational and Applied Mathematics, 11(1), 89-104.

(Continued)

*Primary Examiner* — Samuel G Neway

(57) ABSTRACT

A process for compressing an audio speech signal utilizes ASR processing to generate a corresponding text representation and, depending on confidence in the corresponding text representation, selectively applies more, less, or no compression to the audio signal. The result is a compressed audio signal, with corresponding text, that is compact and well suited for searching, analytics, or additional ASR processing.

16 Claims, 37 Drawing Sheets

(56) References Cited

U.S. PATENT DOCUMENTS

| | | | |
|---|---|---|---|
| 7,136,877 | B2 | 11/2006 | Volcani |
| 7,362,811 | B2* | 4/2008 | Dunne .................. H04B 1/66 704/E19.041 |
| 7,660,715 | B1 | 2/2010 | Thambiratnam |
| 7,738,638 | B1 | 6/2010 | Henderson |
| 7,774,202 | B2 | 8/2010 | Spengler et al. |
| 8,165,114 | B2 | 4/2012 | Halbraich et al. |
| 8,204,053 | B1 | 6/2012 | Williams et al. |
| 8,392,198 | B1 | 3/2013 | Berisha |
| 9,105,053 | B2 | 8/2015 | Cao |
| 9,123,342 | B2 | 9/2015 | Tzyh-Chiang |
| 10,074,089 | B1 | 9/2018 | Rangaraj et al. |
| 10,332,508 | B1 | 6/2019 | Hoffmeister |
| 10,332,517 | B1 | 6/2019 | Wang |
| 10,516,777 | B1 | 12/2019 | Kalkundrikar et al. |
| 10,554,817 | B1 | 2/2020 | Sullivan et al. |
| 10,872,615 | B1* | 12/2020 | Garrod .................. G06F 40/279 |
| 10,977,734 | B1 | 4/2021 | Kenney |
| 2003/0046071 | A1* | 3/2003 | Wyman .................. G10L 15/22 704/E15.04 |
| 2004/0039566 | A1* | 2/2004 | Hutchison .............. G10L 19/00 704/214 |
| 2005/0187768 | A1* | 8/2005 | Godden .................. G10L 15/08 704/238 |
| 2006/0195320 | A1 | 8/2006 | Carpenter |
| 2006/0242038 | A1 | 10/2006 | Giudilli |
| 2007/0294084 | A1 | 12/2007 | Cross et al. |
| 2008/0103761 | A1 | 5/2008 | Printz et al. |
| 2010/0223056 | A1* | 9/2010 | Kadirkamanathan ... G10L 13/08 704/E15.005 |
| 2012/0036364 | A1 | 2/2012 | Yoneda et al. |
| 2012/0109649 | A1 | 5/2012 | Talwar et al. |
| 2014/0156545 | A1 | 6/2014 | Clapham et al. |
| 2014/0192966 | A1 | 7/2014 | Zhang et al. |
| 2014/0297252 | A1 | 10/2014 | Prasad et al. |
| 2014/0325225 | A1 | 10/2014 | Liu et al. |
| 2014/0330563 | A1 | 11/2014 | Faians et al. |
| 2015/0287405 | A1 | 10/2015 | Biadsy et al. |
| 2015/0348540 | A1 | 12/2015 | Ljolje et al. |
| 2015/0371631 | A1 | 12/2015 | Weinstein et al. |
| 2015/0371633 | A1 | 12/2015 | Chelba |
| 2016/0132693 | A1 | 5/2016 | Kumar et al. |
| 2016/0284354 | A1 | 9/2016 | Chen et al. |
| 2016/0372121 | A1 | 12/2016 | Li et al. |
| 2017/0011233 | A1 | 1/2017 | Xue et al. |
| 2017/0092297 | A1* | 3/2017 | Sainath .................. G10L 25/78 |
| 2017/0140174 | A1 | 5/2017 | Lacey et al. |
| 2018/0089412 | A1 | 3/2018 | Kopikare et al. |
| 2018/0137865 | A1 | 5/2018 | Ling |
| 2018/0158464 | A1 | 6/2018 | Sidi et al. |
| 2018/0324293 | A1 | 11/2018 | Davis et al. |
| 2019/0013038 | A1 | 1/2019 | Thomson et al. |
| 2020/0110902 | A1 | 4/2020 | Zakour |
| 2020/0135178 | A1 | 4/2020 | Park et al. |
| 2020/0211561 | A1 | 7/2020 | Degraye et al. |
| 2020/0312337 | A1 | 10/2020 | Stafylakis et al. |

OTHER PUBLICATIONS

Borsky, M., Mizera, P., Pollak, P., & Nouza, J. (2017). Dithering techniques in automatic recognition of speech corrupted by MP3 compression: Analysis, solutions and experiments. Speech Communication, 86, 75-84.

Pollak, P., & Behunek, M. (Jul. 2011). Accuracy of MP3 speech recognition under real-word conditions: Experimental study. In Proceedings of the International Conference on Signal Processing and Multimedia Applications (pp. 1-6). IEEE.

Venkateswarlu, S. C., Prasad, K. S., & Reddy, A. S. (2011). Improve Speech Enhancement Using Weiner Filtering. Global Journal of Computer Science and Technology.

Kulkarni, A. A. (2009). Performance evaluation of an open source speaker recognition system under the effect of speech compression in a real world VoIP environment (Doctoral dissertation, Purdue University).

Tucker, S., & Whittaker, S. (2008). Temporal compression of speech: An evaluation. IEEE transactions on audio, speech, and language processing, 16(4), 790-796.

Benesty, J., Sondhi, M. M., & Huang, Y. A. (2008). Springer Handbook of Speech Processing. Springer, Berlin, Heidelberg.

Laxminarayana, P. Automatic Speech Recognition (ASR) Over VoIP and Wireless Networks.

Baghai-Ravary, L., & Beet, S. W. (1998). Multistep coding of speech parameters for compression. IEEE transactions an speech and audio processing, 6(5), 435-444.

Ivan, K., & Zhenghua, T. (Sep. 2014). Variable frame rate and length analysis for data compression in distributed speech recognition. In 2014 4th IEEE International Conference on Network Infrastructure and Digital Content (pp. 453-457). IEEE.

Reddy, A. P., & Vijayarajan, V. (2020). Audio compression with multi-algorithm fusion and its impact in speech emotion recognition. International Journal of Speech Technology, 1-9.

Jiang, H. (2005). Confidence measures for speech recognition: A survey. Speech communication, 45(4), 455-470.

Litman, D., Hirschberg, J., & Swerts, M. (2000). Predicting automatic speech recognition performance using prosodic cues. In 1st Meeting of the North American Chapter of the Association for Computational Linguistics.

Huang, P. S., Kumar, K., Liu, C., Gong, Y., & Deng, L. (May 2013). Predicting speech recognition confidence using deep learning with word identity and score features. In 2013 IEEE International Conference on Acoustics, Speech and Signal Processing (pp. 7413-7417). IEEE.

Sun, L., Mkwawa, I. H., Jammeh, E., & Ifeachor, E. (2013). Guide to voice and video over IP: for fixed and mobile networks. Springer Science & Business Media.

M. Handley, "Speech Compression.".

Biadsy, F. (2011). Automatic dialect and accent recognition and its application to speech recognition (Doctoral dissertation, Columbia University).

Choueiter, G., Zweig, G., & Nguyen, P. (Mar. 2008). An empirical study of automatic accent classification. In 2008 IEEE International Conference on Acoustics, Speech and Signal Processing (pp. 4265-4268). IEEE.

Hu, Y., Wu, D., & Nucci, A. (2012). Pitch-based gender identification with two-stage classification. Security and Communication Networks, 5(2), 211-225.

Fokoue, E., & Ma, Z. (2013). Speaker gender recognition via MFCCs and SVMs.

Nguyen, P., Tran, D., Huang, X., & Sharma, D. (Aug. 2010). Automatic classification of speaker characteristics. In International Conference on Communications and Electronics 2010 (pp. 147-152). IEEE.

Meinedo, H., & Trancoso, I. (2011). Age and gender detection in the l-DASH project. ACM Transactions on Speech and Language Processing (TSLP), 7(4), 1-16.

Basu, S., Chakraborty, J., Bag, A., & Aftabuddin, M. (Mar. 2017). A review on emotion recognition using speech. In 2017 International Conference on Inventive Communication and Computational Technologies (ICICCT) (pp. 109-114). IEEE.

Rajvanshi, K., & Khunteta, A. (2018). An Efficient Approach for Emotion Detection from Speech Using Neural Networks. International Journal for Research in Applied Science & Engineering Technology, 6(05).

Wagner, J. (2005). EmoVoice—Real-Time Emotion Recognition from Speech. Published on: Jan. 1.

https://en.wikipedia.org/wiki/Sentiment_analysis (accessed on Dec. 6, 2020).

Sidana, M. (2017). Top five emotion/sentiment analysis APIs for understanding user sentiment trends.

PCT Search Report and Written Opinion dated Aug. 26, 2021 PCT/US2020/070944. 10 pages.

* cited by examiner

ASR-ENHANCED SPEECH COMPRESSION

CROSS-REFERENCE TO RELATED APPLICATION

This application is a continuation of U.S. patent application Ser. No. 16/371,014, filed Mar. 31, 2019, which '014 application is incorporated by reference herein.

FIELD OF THE INVENTION

This invention relates generally to the fields of audio/speech data processing, audio/speech data archiving, and audio/speech data analytics. More specifically, the invention relates to improved processes/systems for compressing and archiving speech data—such as recorded telephone calls—in highly compressed formats that still permit effective searching and speech-to-text (ASR) processing of the archived data.

BACKGROUND OF THE INVENTION

Automatic speech recognition is a well-known and widely available technology. State-of-the-art ASR systems are available from companies such as Nuance Communications, Google, and Voci Technologies. There are also several open source ASR packages, such as Sphinx, HTK, and Kaldi. See https://en.wikipedia.org/wiki/List_of_speech_recognition_software#Open_source_acoustic_models_and_speech_corpus_(compilation).

In ASR, "confidence" represents an estimate of the likelihood that the ASR engine has correctly recognized a given word or utterance. Various approaches are known for estimating ASR confidence. The most common approaches involve comparing the relative ranking(s) of the selected decoding versus the non-selected decoding(s). If the selected decoding was ranked far higher by the recognizer than the alternative(s), then the confidence in its correctness is higher; whereas if the selected decoding was not strongly preferred by the recognizer, then the confidence in its correctness is lower.

Other approaches to estimating ASR confidence are known and available in the prior art. See, e.g., H. Jiang, "Confidence measures for speech recognition: a survey," Speech Communication, April 2005 (incorporated by reference herein; copy available at http://www-gth.die.upm.es/research/documentation/reference/Jang_Confidence.pdf); D. J. Brems, et al., "Automatic speech recognition (ASR) processing using confidence measures," U.S. Pat. No. 5,566,272 (incorporated by reference herein); D. J. Litman, et al., "Predicting automatic speech recognition performance using prosodic cues," Proceedings of the 1st North American chapter of the Association for Computational Linguistics conference, 2000 (incorporated by reference herein; copy available at https://aclanthology.info/pdf/A/A00/A00-2029.pdf); P. S. Huang, et al., "Predicting speech recognition confidence using deep learning with word identity and score features," IEEE International Conference on Acoustics, Speech and Signal Processing, 2013 (incorporated by reference herein; copy available at https://www.microsoft.com/en-us/research/wp-content/uploads/2016/02/ConfidenceEstimator.pdfP.

Speech compression is also a mature and widely utilized technology. See, e.g., L. Sun, et al., "Speech Compression," chapter 2 of "Guide to Voice and Video over IP for Fixed and Mobile Networks," Springer, 2013 (incorporated by reference herein; copy available at https://www.springer.com/cda/content/document/cda_downloaddocument/9781447149040-c2.pdf?SGWID=0-0-45-1369003-p174740098). See also M. Handley, "Speech Compression," incorporated by reference herein (copy available at http://www0.cs.ucl.ac.uk/teaching/GZ05/04-speech-coding.pdf). Speech compression is widely utilized in the recording/archiving of contact center telephone calls.

While many businesses maintain enormous quantities of stored audio that they would like to mine for business insights, such stored audio only becomes useful for analytics after it has undergone an ASR conversion to text. With modern resources, it is now feasible to apply ASR processing to large archives of stored audio; however, in such applications, the speech compression that is used in such archives presents a major barrier to accurate recognition of the spoken words. See P. Pollak, et al., "Small and Large Vocabulary Speech Recognition of MP3 Data under Real-Word Conditions: Experimental Study," 2001 (copy available at http://noel.feld.cvut.cz/speechlab/publicaitons/086 POL12 CCIS.pdf).

In addition to text, computerized speech data analysis can be used to reveal various items of speech-related metadata, such as identity of the speaker, gender, approximate age, emotion, and sentiment.

As explained in https://en.wikipedia.org/wiki/Speaker_recognition (downloaded Jun. 11, 2018), > Speaker recognition is the identification of a person from characteristics of voices (voice biometrics). It is also called voice recognition. There is a difference between speaker recognition (recognizing who is speaking) and speech recognition (recognizing what is being said). These two terms are frequently confused, and "voice recognition" can be used for both. In addition, there is a difference between the act of authentication (commonly referred to as speaker verification or speaker authentication) and identification. Finally, there is a difference between speaker recognition (recognizing who is speaking) and speaker diarization (recognizing when the same speaker is speaking).
>
> Speaker recognition has a history dating back some four decades and uses the acoustic features of speech that have been found to differ between individuals. These acoustic patterns reflect both anatomy (e.g., size and shape of the throat and mouth) and learned behavioral patterns (e.g., voice pitch, speaking style). Speaker verification has earned speaker recognition its classification as a "behavioral biometric".
>
> Speaker recognition is a pattern recognition problem. The various technologies used to process and store voice prints include frequency estimation, hidden Markov models, Gaussian mixture models, pattern matching algorithms, neural networks, matrix representation, Vector Quantization and decision trees. Some systems also use "anti-speaker" techniques, such as cohort models, and world models. Spectral features are predominantly used in representing speaker characteristics.

Technology also currently exists that enables voice-based determination of a caller's demographic profile information. One example is the caller's speaking dialect. See, e.g., F. Biadsy, "Automatic Dialect and Accent Recognition and its Application to Speech Recognition," Ph.D. Thesis, Columbia Univ., 2011 (incorporated by reference herein; copy available at http://www.ce.columbia.edu/speech/Thesis-Files/fadi_biadsy.pdf); F. Biadsy, et al., "Dialect-specific acoustic language modeling and speech recognition," U.S. Pat. Pub. No. 2015/0287405, Oct. 8, 2015 (incorporated by reference herein); G. Talwar, et al., "Speech dialect classification for automatic speech recognition," U.S. Pat. Pub. No. 2012/0109649, May 3, 2012 (incorporated by reference herein); and G. Choueiter, et al., "An empirical study of automatic accent classification," IEEE ICASSP 2008, pp. 4265-4268 (incorporated by reference herein; copy available at https://groups.csail.mit.edu/sls/publications/2008/ICASSP08_Choueiter_MSR.pdf).

Another example is the caller's gender. See, e.g., Y. Hu, et al., "Pitch-based Gender Identification with Two-stage Classification," Security and Communication Networks 5(2):211-225 (2012) (incorporated by reference herein; copy available at) http://www.wu.ece.ufl.edu/mypapers/GenderIdentification.pdf); H. Printz, et al., "Method and Apparatus for Automatically Determining Speaker Characteristics for Speech-Directed Advertising or Other Enhancement of Speech-Controlled Devices or Services," U.S. Pat. Pub. No. 2008/0103761 (incorporated by reference herein); E. Fokoue, et al., "Speaker Gender Recognition via MFCCs and SVMs" Rochester Inst. of Tech., 2013 (incorporated by reference herein; copy available at http://scholarworks.rit.edu/article/1749).

Yet another example is the caller's (approximate) age. See, e.g., P. Nguyen, et al., "Automatic classification of speaker characteristics," Communications and Electronics (ICCE), 2010 (incorporated by reference herein; copy available at http://fit.hcmup.edu.vn/~haits/Conference/ICCE%202010/Full%20Papers/SA/Automatic%20Classification%20of%20Speaker%20Characheristics.pdf); H. Meinedo, et al., "Age and Gender Detection in the I-DASH Project," ACM Trans. on Speech & Lang. Process., August 2011 (incorporated by reference herein; copy available at http://www.inesc-id.pt/pt/indicadores/Ficheiros/7554.pdf); O. Chen, et al., "Method of recognizing gender or age of a speaker according to speech emotion or arousal," U.S. Pat. No. 9,123,342 (incorporated by reference herein); Y. Cao, et al., "Method and apparatus for determining a user age range," U.S. Pat. No. 9,105,053 (incorporated by reference herein).

Technology also exists to ascertain speaker emotion—e.g., "happy," "sad," "angry," etc.—from the acoustic quality of the speaker's voice. See, e.g., S. Basu, et al., "A review on emotion recognition using speech," 2017 IEEE International Conference on Inventive Communication and Computational Technologies; See also K. Rajvanshi, et al., "An Efficient Approach for Emotion Detection from Speech Using Neural Networks" (incorporated by reference herein; copy available at http://ijraset.com/fileserve.php?FID=17181). Open source emotion detection packages are available. See, e.g., "EmoVoice—Real-time emotion recognition from speech," available at https://www.informatik.uni-augsburq.de/lehrstuehle/hcm/projects/tools/emovoice/ ("EmoVoice is a comprehensive framework for real-time recognition of emotions from acoustic properties of speech") (incorporated by reference herein).

The term "sentiment analysis," as used herein, refers to the use of natural language processing (NLP), text analysis, and/or computational linguistics to identify, extract, quantify, and/or study affective states and subjective information. Sentiment analysis is traditionally applied to voice-of-the-customer (VoC) materials, such as reviews and survey responses, online and social media, and healthcare materials for applications that range from marketing to customer service to clinical medicine. See, e.g., U.S. Pat. No. 7,136,877, "System and method for determining and controlling the impact of text," incorporated herein by reference. Most sentiment analysis systems attempt to classify a sentence (or other text grouping) as "positive," "negative," or "neutral." Others may, instead or in addition, assign emotional state labels—such as "angry," "sad," or "happy"- to the analyzed text. Numerous open source sentiment analysis packages are available, as described in https://en.wikipedia.org/wiki/Sentiment_analysis (incorporated by reference herein). Sentiment analysis is also available as a cloud-based service. See M. Sidana, "Top Five Emotion/Sentiment Analysis APIs for understanding user sentiment trends," available at https://medium.com/@sifium/top-five-emotional-sentiment-analysis-apis-116cd8d42055.

Thus, while there exist many technologies/tools to analyze, process, compress and store speech recordings, there still exists a persistent, negative tradeoff: Storing large quantities of speech data requires heavy compression, but heavy compression destroys the useful, otherwise extractable information.

SUMMARY OF THE INVENTION

As illustrated and claimed hereinbelow, preferred embodiments of this invention utilize ASR processing and confidence estimation to govern the compression level, typically on an utterance-by-utterance basis. As a result, utterances that have been confidently recognized will see their audio heavily compressed in the output stream, whereas utterances that have not been confidently recognized (and/or which trigger other alerts, such as angry emotion, known fraudster, or child age) will see their audio uncompressed or lightly compressed in the output stream.

Accordingly, generally speaking, and without intending to be limiting, one aspect of the invention relates to computer-implemented process for digitally compressing an audio signal that includes human speech utterances by, for example: (1) receiving a digitally encoded audio signal that includes human speech utterances in a first, uncompressed format; (2) identifying portions of the digitally encoded audio signal that correspond to speech utterances and, for each speech utterance, forming a corresponding uncompressed audio utterance; (3) performing automatic speech recognition (ASR) processing to produce, for each speech utterance, at least a corresponding (i) text representation and (ii) ASR confidence that represents a likelihood that the text representation accurately captures all spoken words contained in its corresponding uncompressed audio utterance; (4) for each speech utterance, if its ASR confidence exceeds a predetermined threshold value, then forming a corresponding compressed audio utterance in a highly compressed format; (5) forming an output stream that includes, for each speech utterance, at least: (i) its corresponding text representation; (ii) its corresponding ASR confidence; and (iii) either (a) its corresponding uncompressed audio utterance or (b) its corresponding compressed audio utterance, but not both (a) and (b), wherein the output stream contains (a) if the utterance's corresponding ASR confidence is less than or equal to the predetermined threshold value and (b) if the utterance's corresponding ASR confidence exceeds the predetermined threshold value.

In some embodiments, for each speech utterance, the output stream further includes metadata computed from the corresponding uncompressed audio utterance. In some embodiments, such metadata includes one or more of: identity of the speaker, gender, approximate age, and/or emotion.

In some embodiments, the ASR confidence values are derived from normalized likelihood scores.

In some embodiments, the ASR confidence values are computed using an N-best homogeneity analysis.

In some embodiments, the ASR confidence values are computed using an acoustic stability analysis.

In some embodiments, the ASR confidence values are computed using a word graph hypothesis density analysis.

In some embodiments, the ASR confidence values are derived from associated state, phoneme, or word durations.

In some embodiments, the ASR confidence values are derived from language model (LM) scores or LM back-off behaviors.

In some embodiments, the ASR confidence values are computed using a posterior probability analysis.

In some embodiments, the ASR confidence values are computed using a log-likelihood-ratio analysis.

In some embodiments, the ASR confidence values are computed using a neural net that includes word identity and aggregated words as predictors.

Again, generally speaking, and without intending to be limiting, another aspect of the invention relates to computer-implemented process for digitally compressing an audio signal that includes human speech utterances by, for example: (1) receiving a digitally encoded audio signal that includes human speech utterances in a first, lightly compressed format; (2) identifying portions of the digitally encoded audio signal that correspond to speech utterances and, for each speech utterance, forming a corresponding lightly compressed audio utterance; (3) performing automatic speech recognition (ASR) processing to produce, for each speech utterance, at least a corresponding (i) text representation and (ii) ASR confidence that represents a likelihood that the text representation accurately captures all spoken words contained in its corresponding lightly compressed audio utterance; (4) for each speech utterance, if its ASR confidence exceeds a predetermined threshold value, then forming a corresponding heavily compressed audio utterance in a highly compressed format; (5) forming an output stream that includes, for each speech utterance, at least: (i) its corresponding text representation; (ii) its corresponding ASR confidence; and (iii) either (a) its corresponding lightly compressed audio utterance or (b) its corresponding heavily compressed audio utterance, but not both (a) and (b), wherein the output stream contains (a) if the utterance's corresponding ASR confidence is less than or equal to the predetermined threshold value and (b) if the utterance's corresponding ASR confidence exceeds the predetermined threshold value.

Again, generally speaking, and without intending to be limiting, one aspect of the invention relates to computer-implemented process for digitally compressing an audio signal that includes human speech utterances by, for example: (1) receiving a digitally encoded audio signal that includes human speech utterances in a first, lightly compressed format; (2) identifying portions of the digitally encoded audio signal that correspond to speech utterances and, for each speech utterance, forming a corresponding lightly compressed audio utterance; (3) performing automatic speech recognition (ASR) processing to produce, for each speech utterance, at least a corresponding (i) text representation and (ii) ASR confidence that represents a likelihood that the text representation accurately captures all spoken words contained in its corresponding lightly compressed audio utterance; (4) for each speech utterance, if its ASR confidence exceeds a predetermined threshold value, then forming a corresponding heavily compressed audio utterance in a highly compressed format; (5) forming an output stream that, for each speech utterance, consists essentially of: (i) its corresponding text representation; (ii) its corresponding ASR confidence; and (iii) either (a) its corresponding lightly compressed audio utterance or (b) its corresponding heavily compressed audio utterance, but not both (a) and (b), wherein the output stream contains (a) if the utterance's corresponding ASR confidence is less than or equal to the predetermined threshold value and (b) if the utterance's corresponding ASR confidence exceeds the predetermined threshold value.

In some embodiments, for each speech utterance, the output stream further consists essentially of metadata computed from the corresponding lightly compressed audio utterance.

In some embodiments, such metadata includes one or more of: identity of the speaker, gender, approximate age, and/or emotion.

BRIEF DESCRIPTION OF THE FIGURES

Aspects, features, and advantages of the present invention, and its numerous exemplary embodiments, can be further appreciated with reference to the accompanying set of figures, in which.

FURTHER DESCRIPTION OF ILLUSTRATIVE EMBODIMENTS

Referring to FIGS. 10-28, the depicted data link(s) are each preferably provisioned as one or more secure data tunnels, using, for example, a secure shell (SSH) protocol. See https://en.wikipedia.org/wiki/Tunneling_protocol (incorporated by reference herein). Indeed, such SSH-provisioned data link(s) may be used to support any, or all, of the data communication links between functional or structural components of the various embodiments herein.

Figure 1:
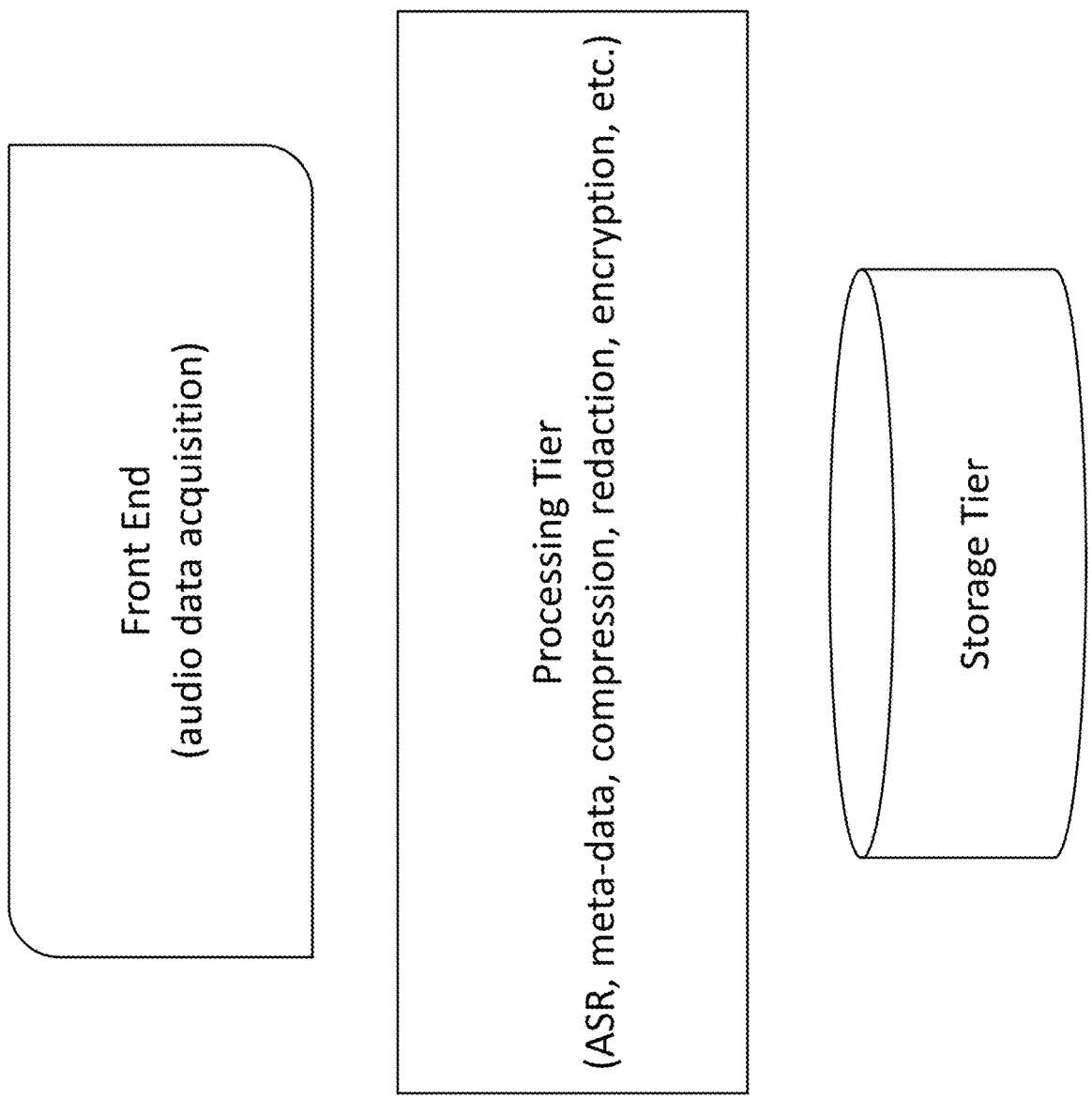
FIG. 1 is a high-level block diagram, showing a Front End, Processing Tier, and Storage Tier.
Figure 2:
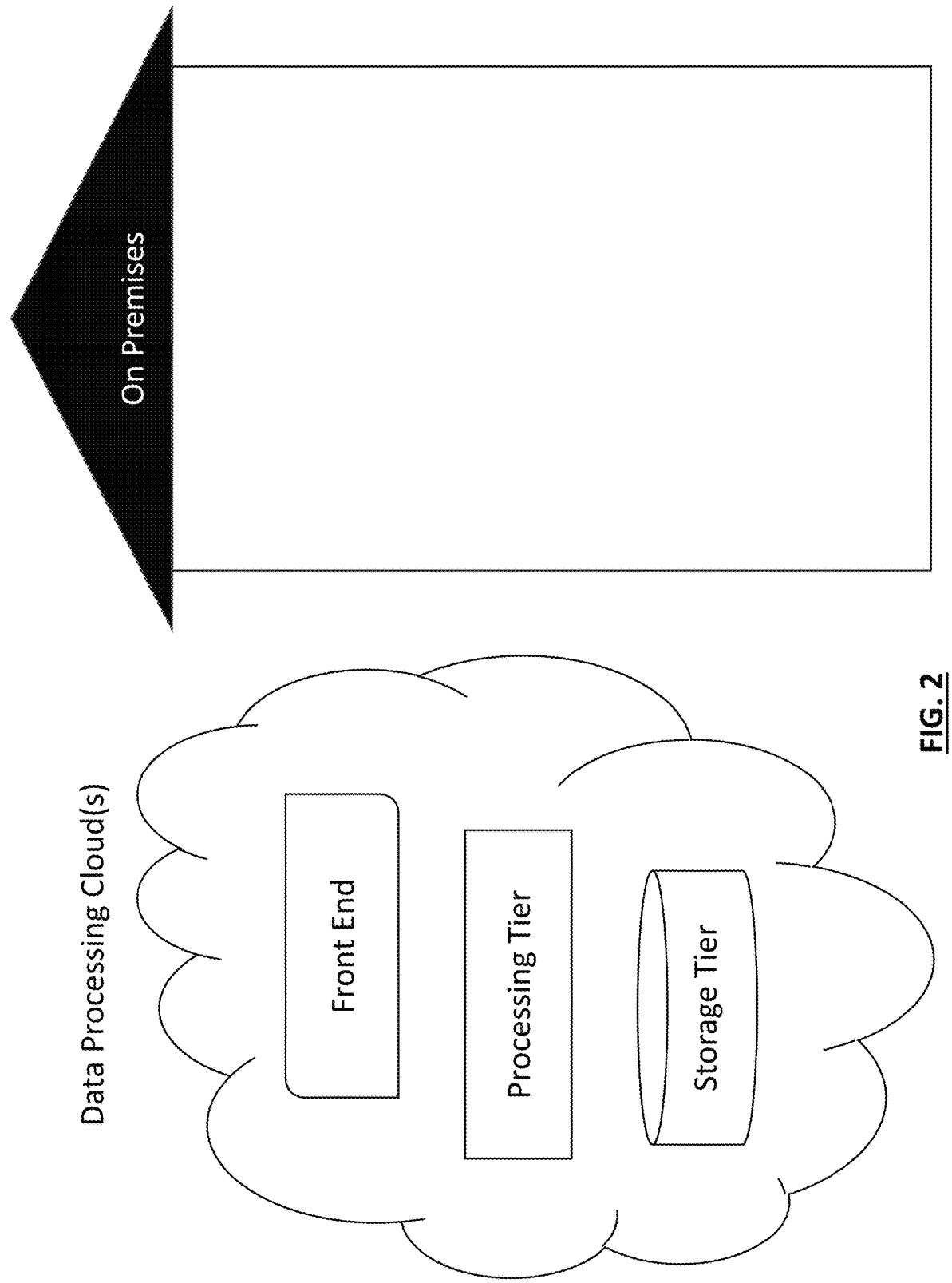
FIG. 2 depicts an exemplary embodiment in which the Front End, Processing Tier, and Storage Tier are all provisioned in one or more Data Processing Cloud(s)
Figure 3:
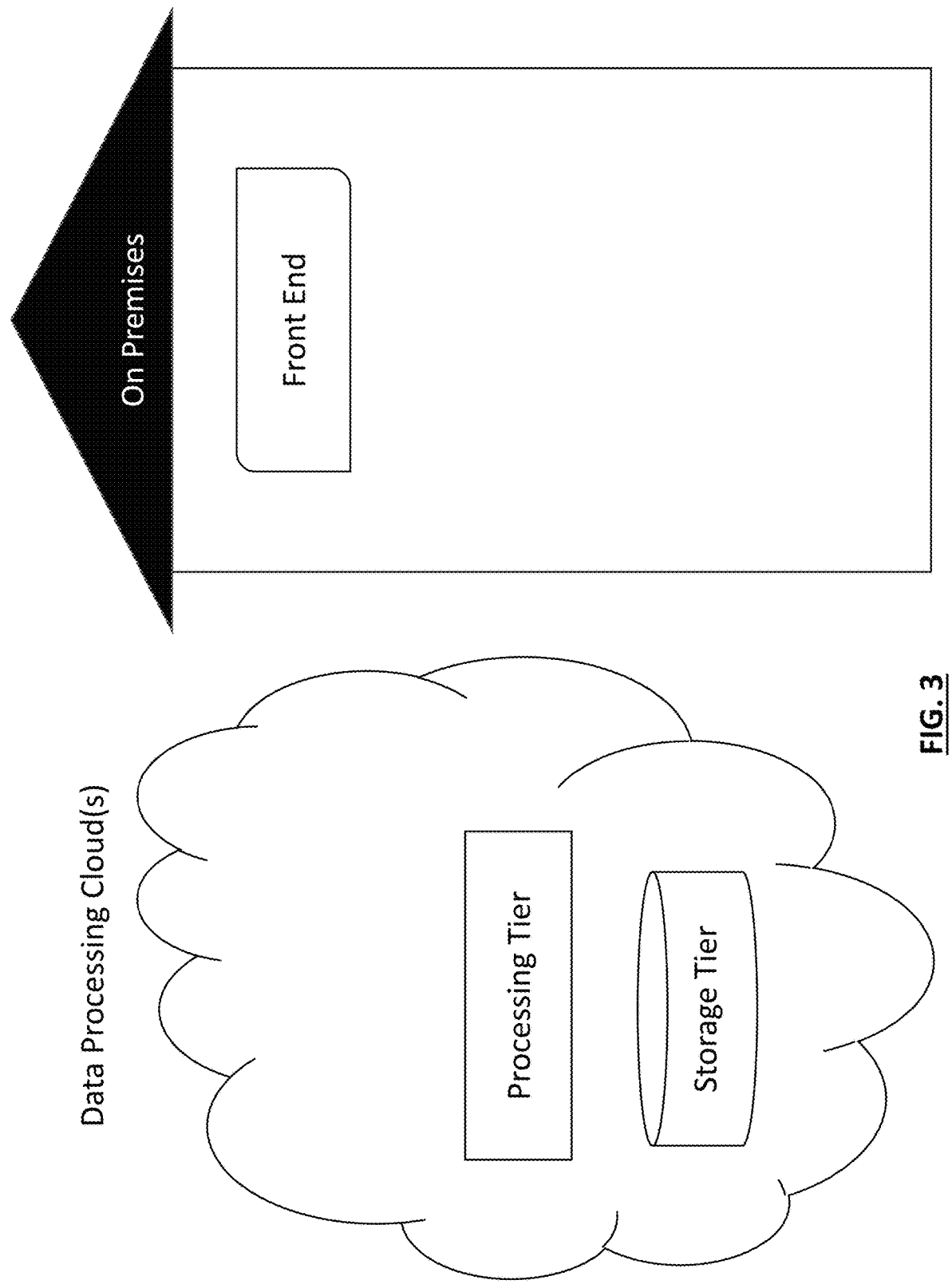
FIG. 3 depicts an exemplary embodiment in which the Processing and Storage Tiers are provisioned in Data Processing Cloud(s), and the Frond End is provisioned On Premises.
Figure 4:
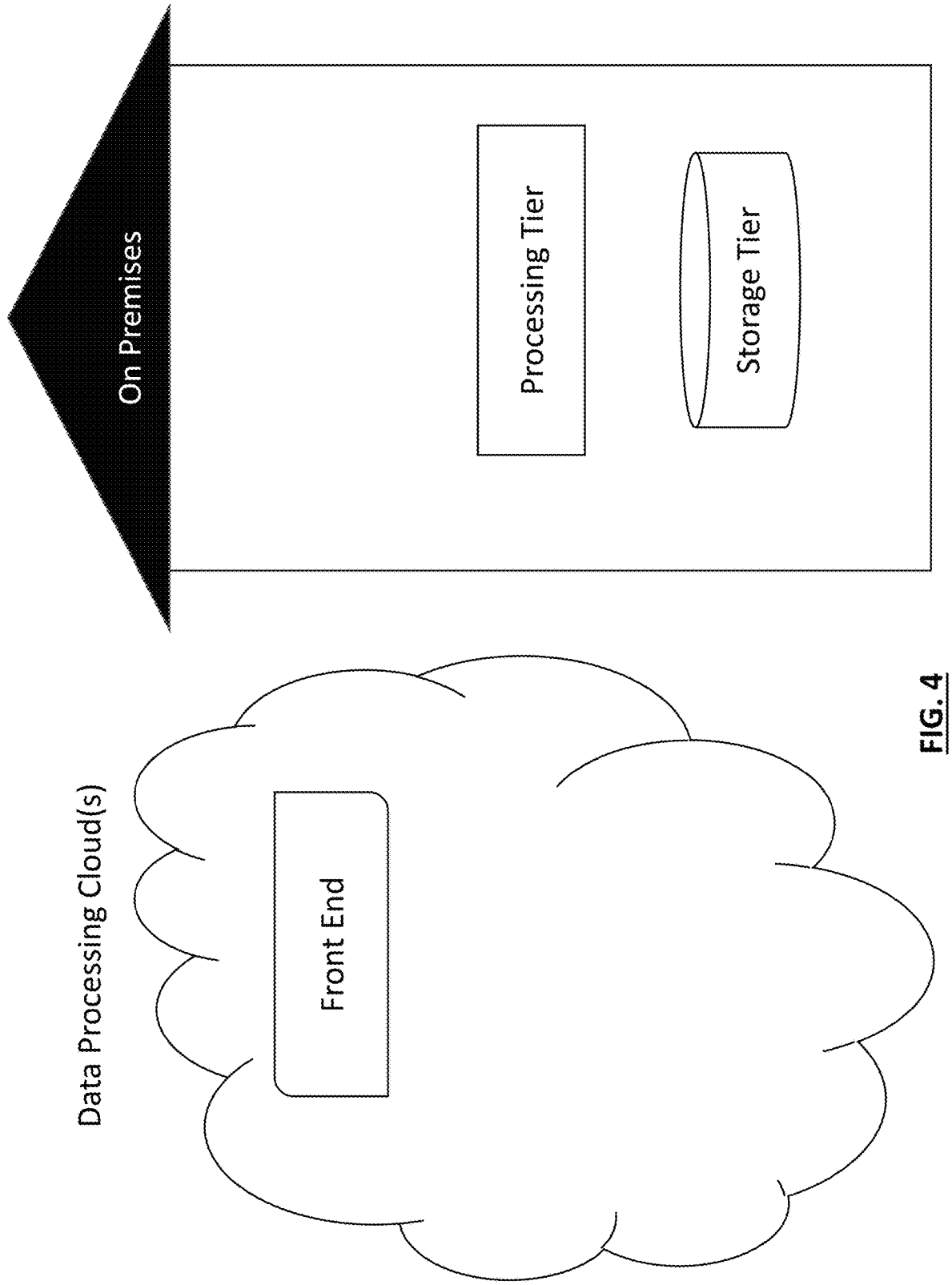
FIG. 4 depicts an exemplary embodiment in which the Front End is provisioned in a Data Processing Cloud, and the Processing and Storage Tiers are provisioned On Premises.
Figure 5:
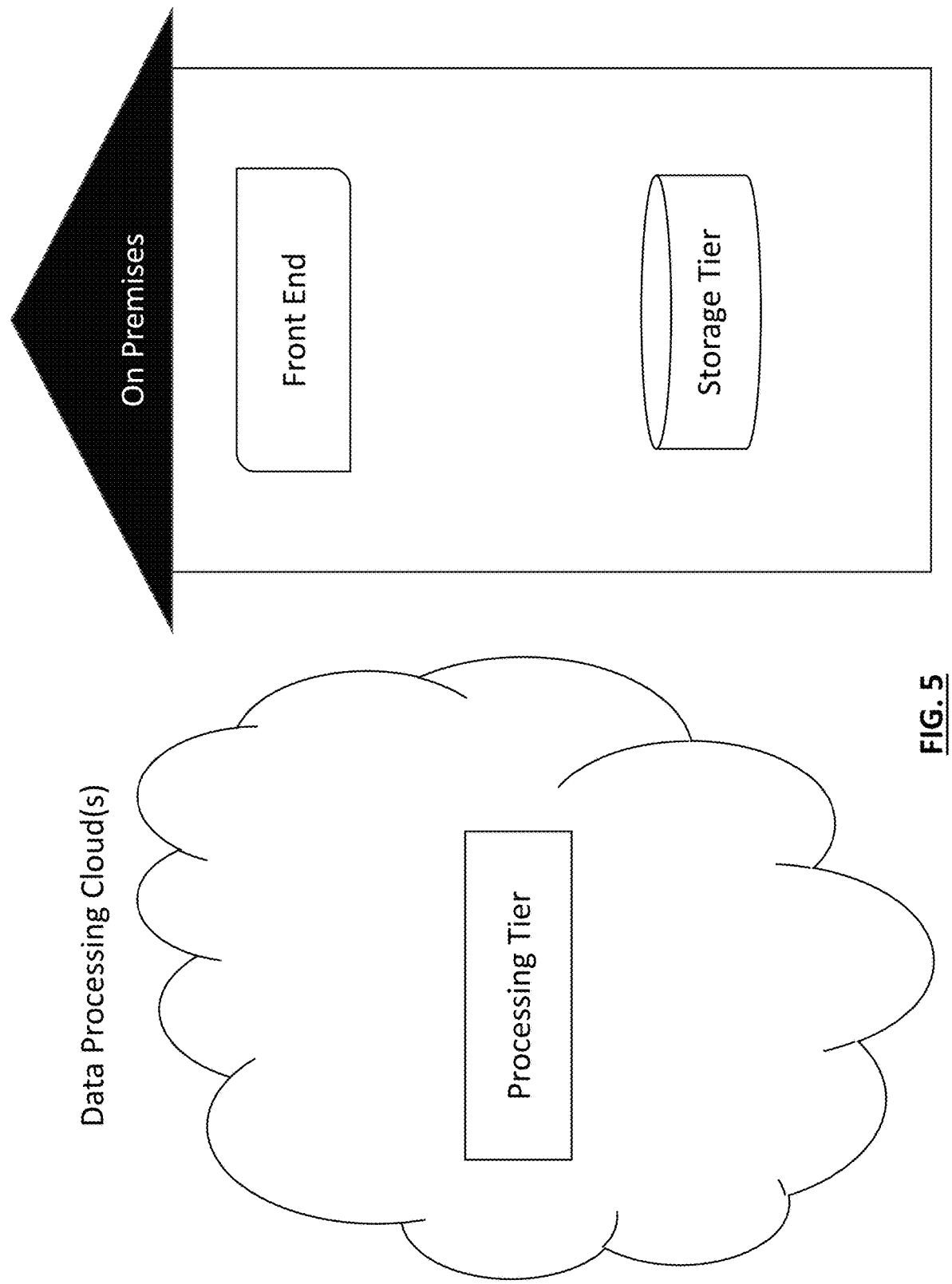
FIG. 5 depicts an exemplary embodiment in which the Processing Tier is provisioned in a Data Processing Cloud, and the Front End and Storage Tier are provisioned On Premises.
Figure 6:
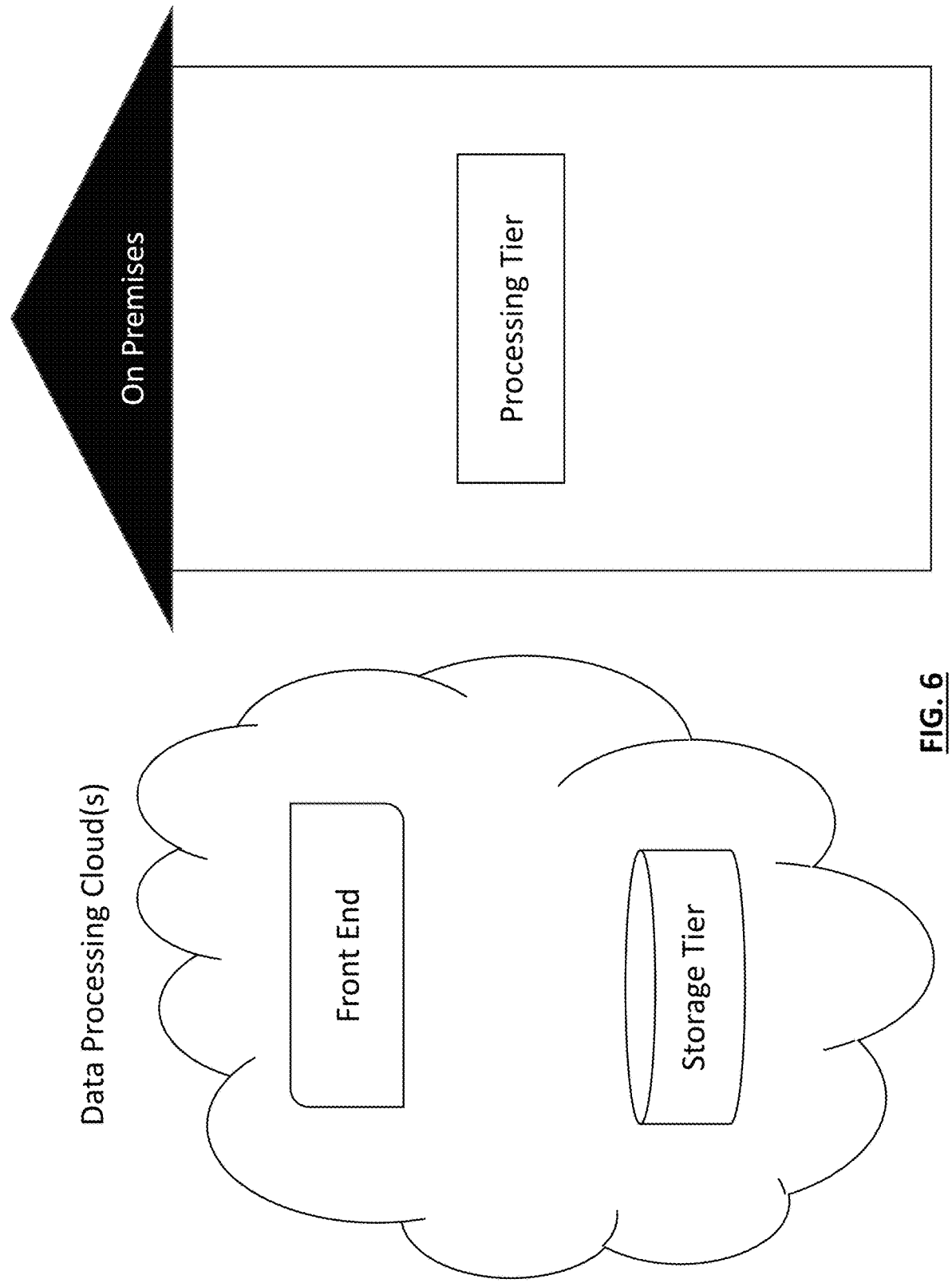
FIG. 6 depicts an exemplary embodiment in which the Front End and Storage Tier are provisioned in Data Processing Cloud(s), and the Processing Tier is provisioned On Premises.
Figure 7:
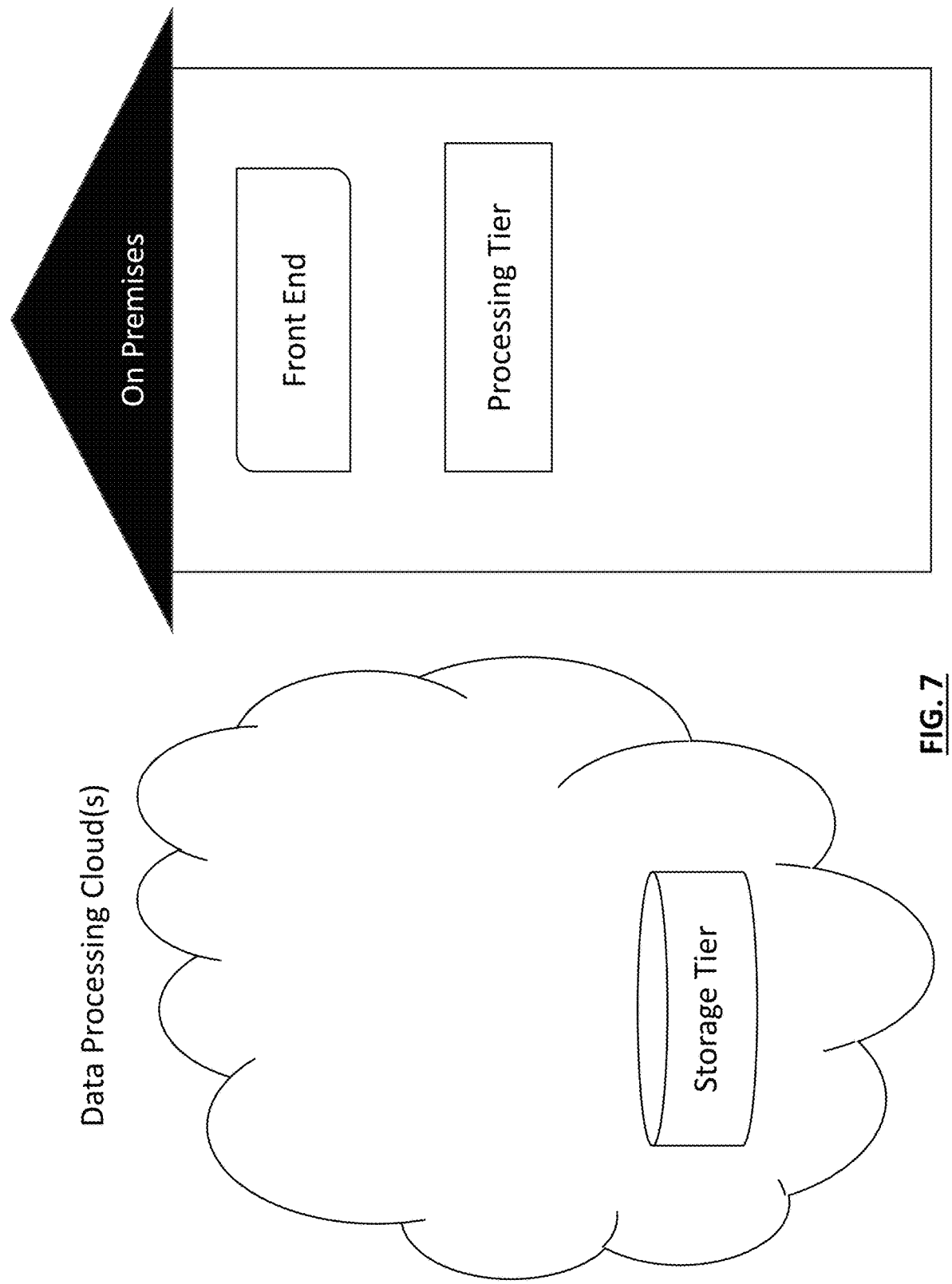
FIG. 7 depicts an exemplary embodiment in which the Storage Tier is provisioned in a Data Processing Cloud, and the Front End and Processing Tier are provisioned On Premises.
Figure 8:
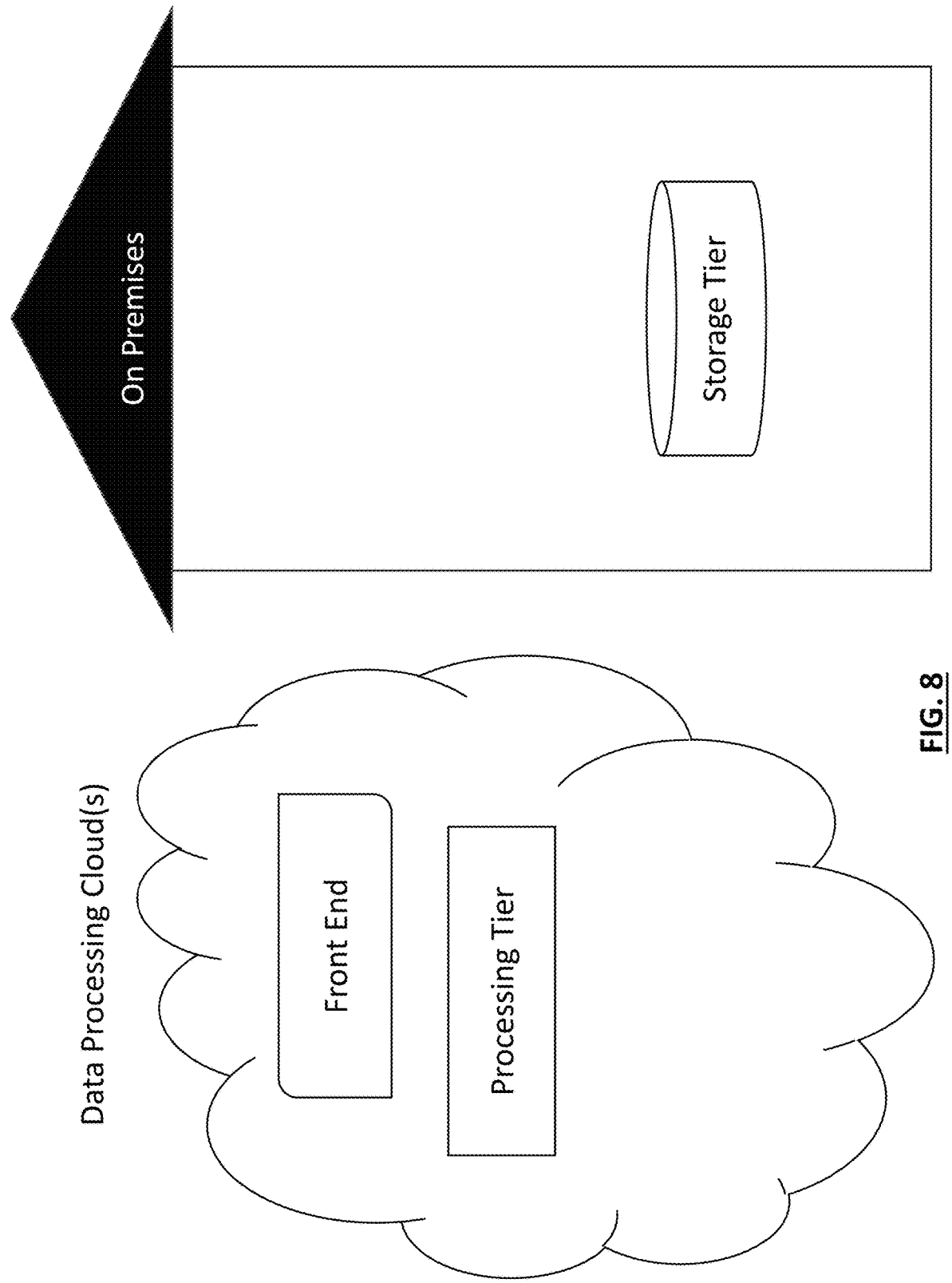
FIG. 8 depicts an exemplary embodiment in which the Front End and Processing Tier are provisioned in Data Processing Cloud(s), and the Storage Tier is provisioned On Premises.
Figure 9:
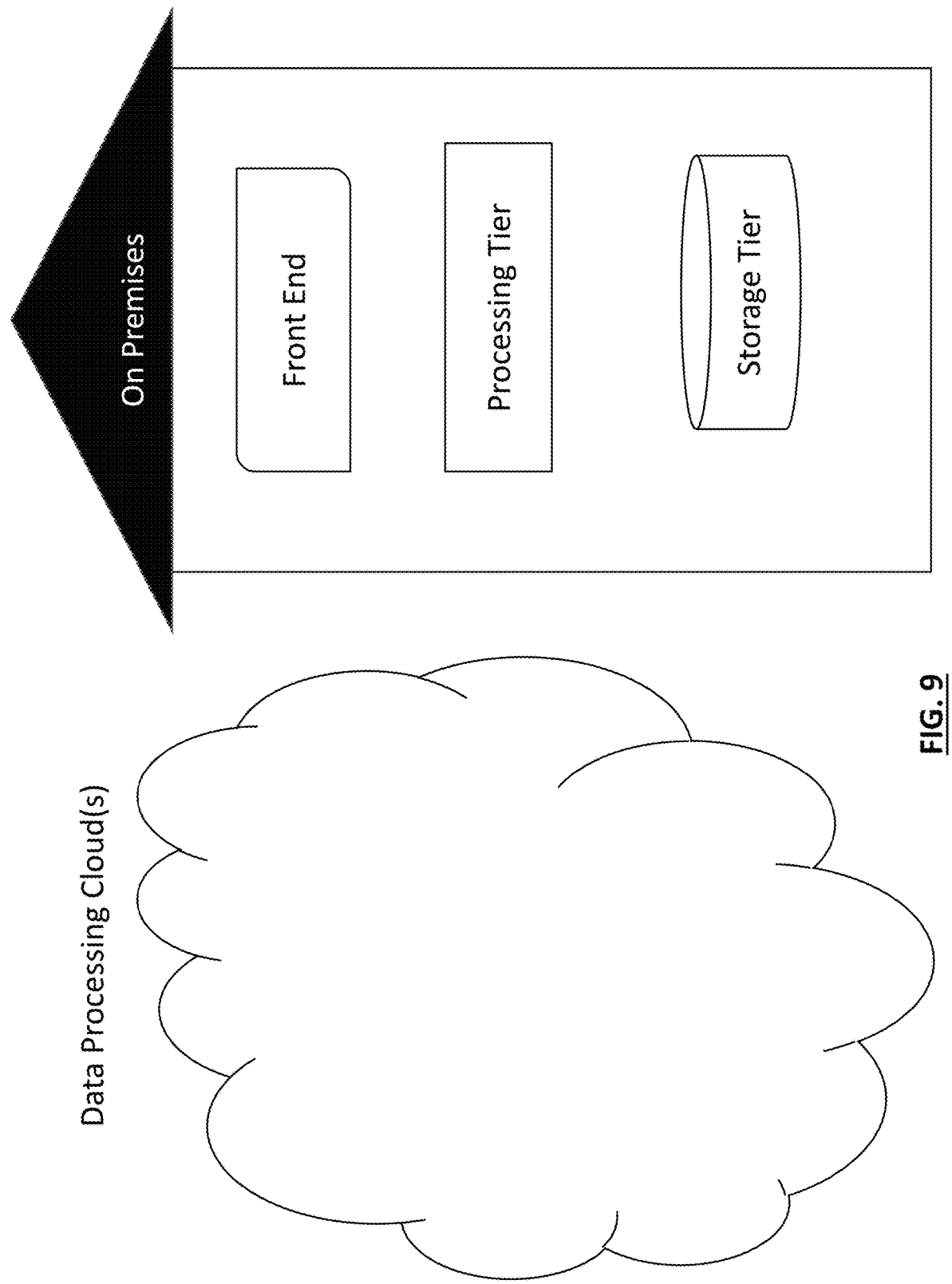
FIG. 9 depicts an exemplary embodiment in which the Front End, Processing Tier, and Storage Tier are provisioned On Premises.
Figure 10:
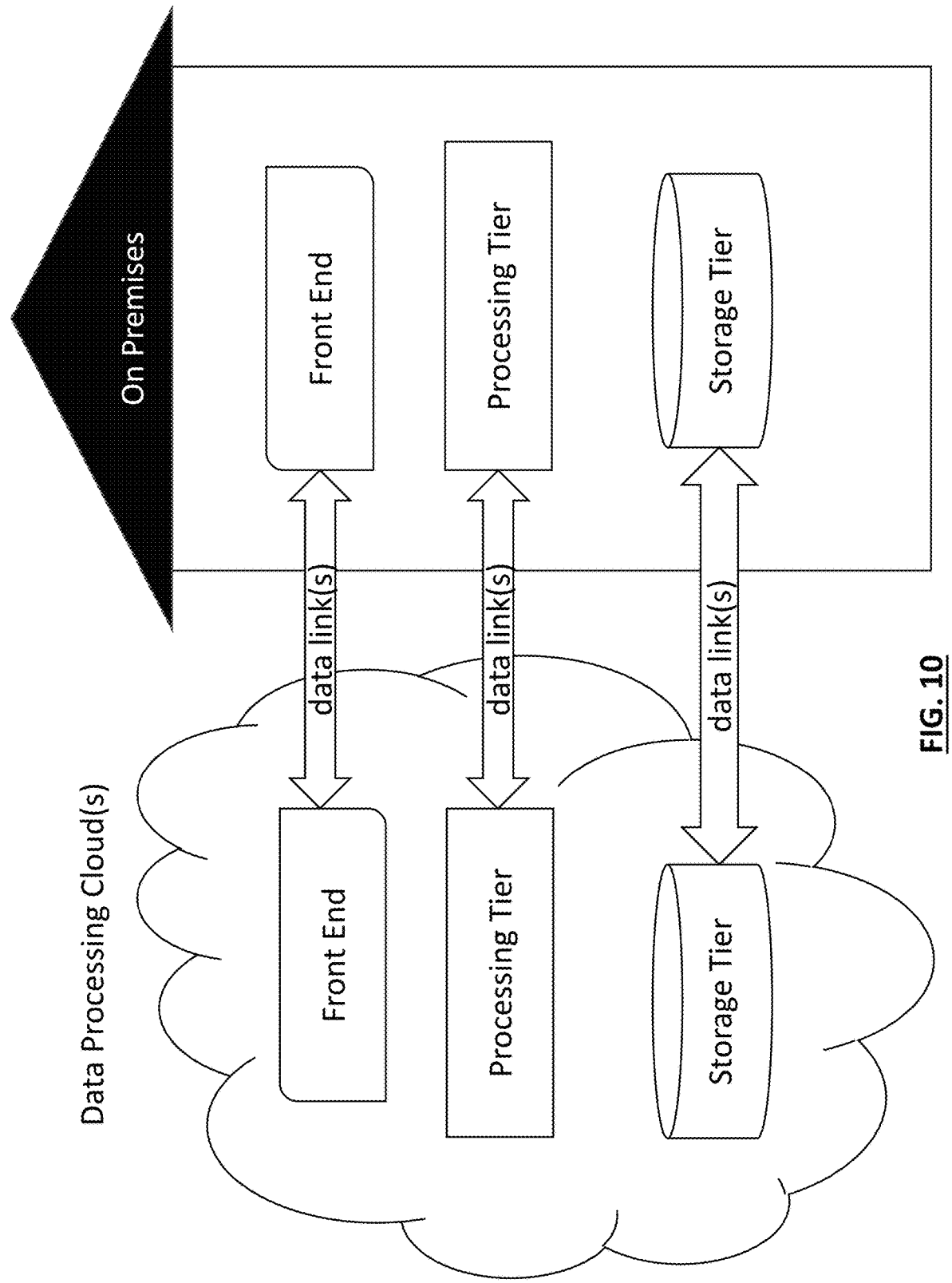
FIG. 10 depicts an exemplary embodiment in which the Front End, Processing Tier, and Storage Tier are provisioned partly in Data Processing Cloud(s) and partly On Premises.
Figure 11:
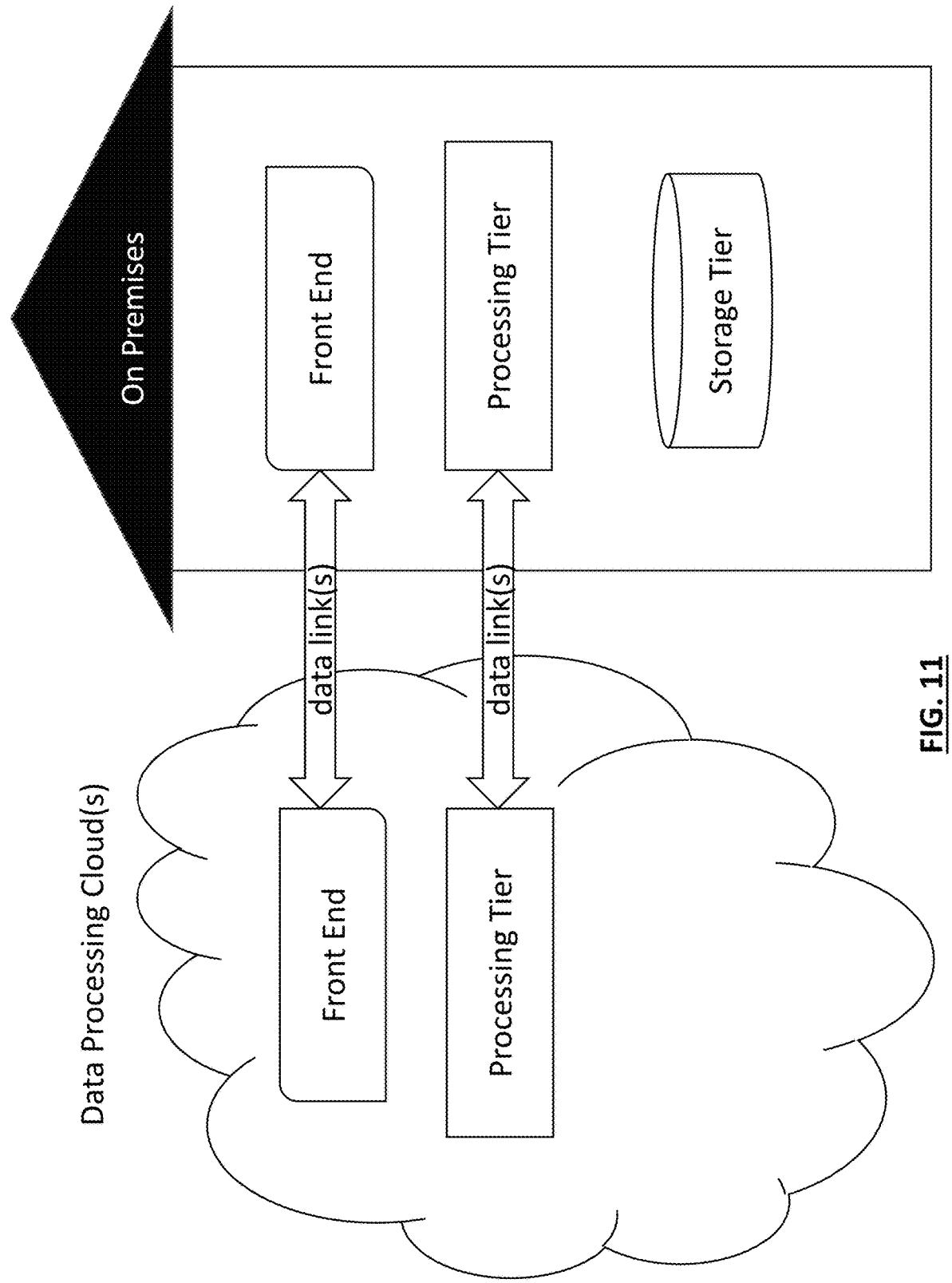
FIG. 11 depicts an exemplary embodiment in which the Front End and Processing Tier are provisioned partly in Data Processing Cloud(s) and partly On Premises, and the Storage Tier is provisioned On Premises.
Figure 12:
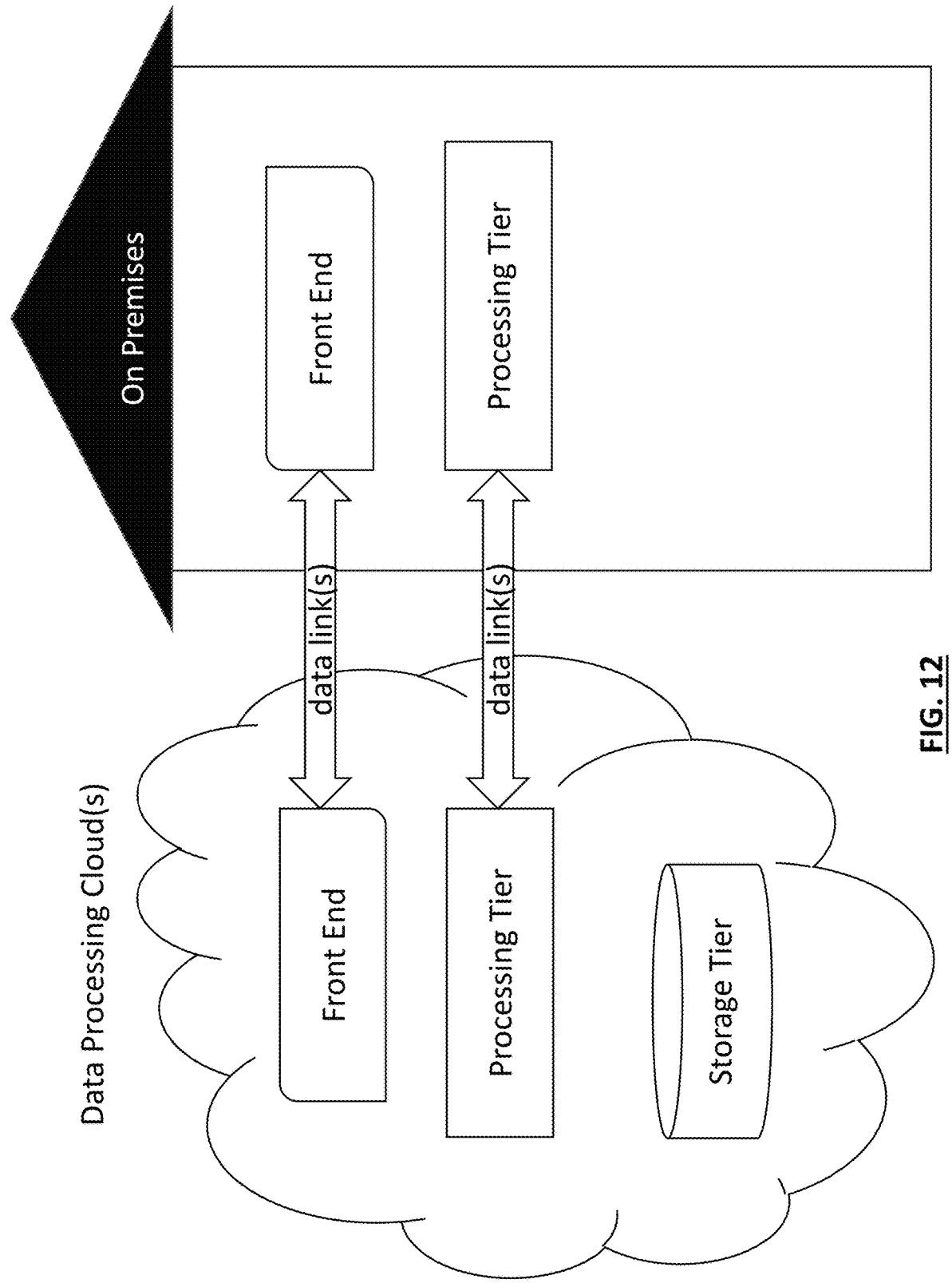
FIG. 12 depicts an exemplary embodiment in which the Front End and Processing Tier are provisioned partly in Data Processing Cloud(s) and partly On Premises, and the Storage Tier is provisioned in a Data Processing Cloud.
Figure 13:
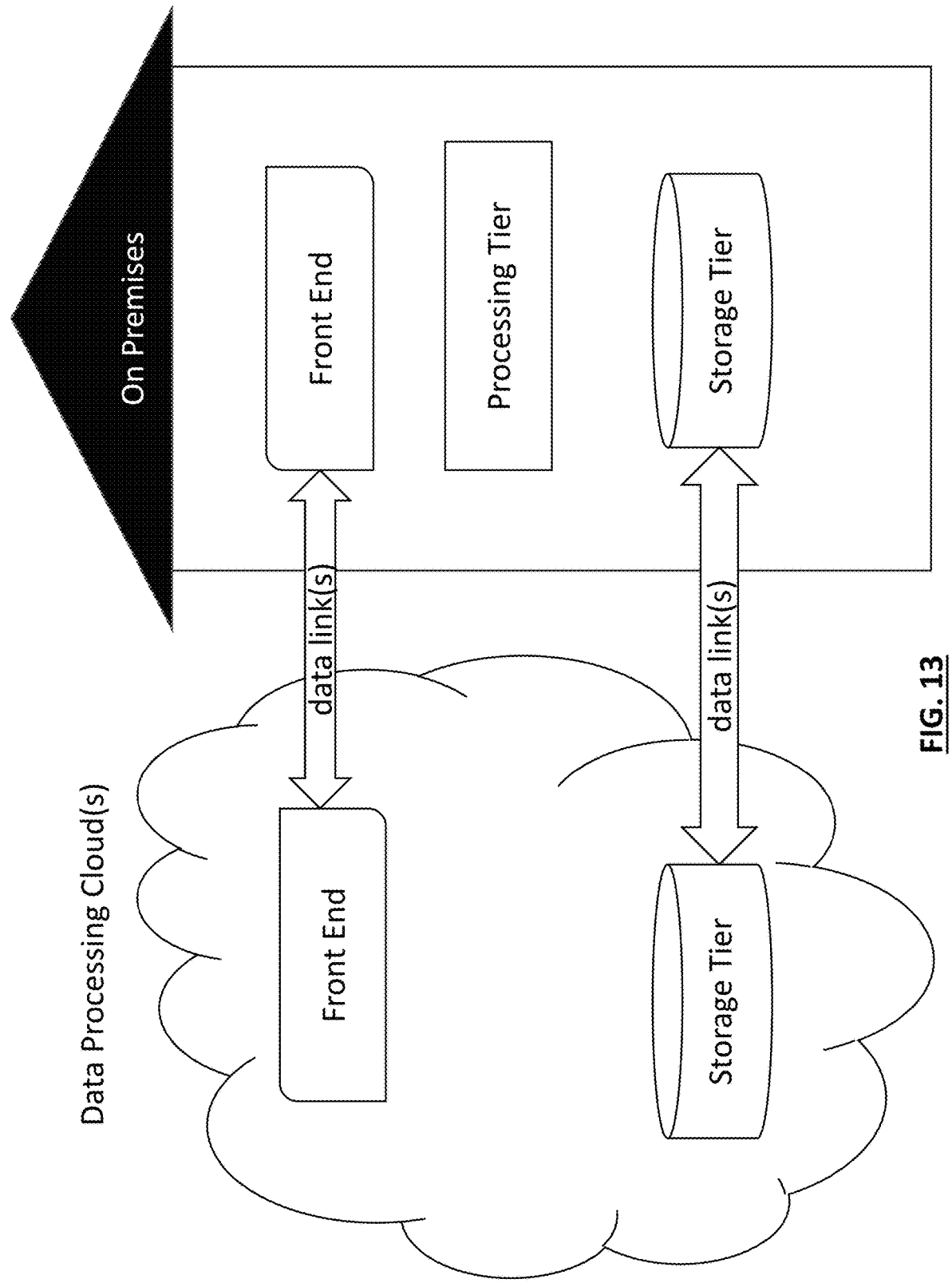
FIG. 13 depicts an exemplary embodiment in which the Front End and Storage Tier are provisioned partly in Data Processing Cloud(s) and partly On Premises, and the Processing Tier is provisioned On Premises.
Figure 14:
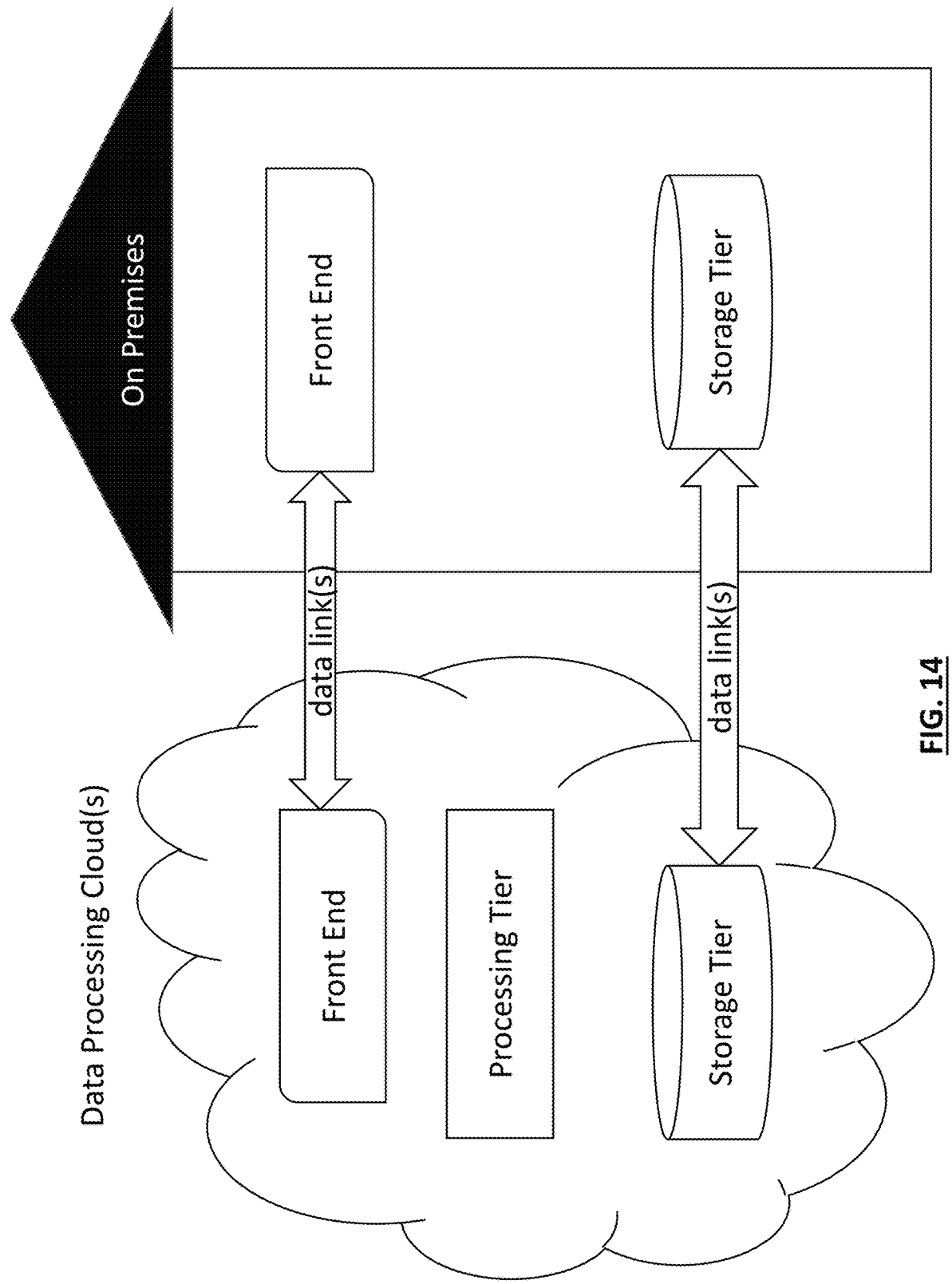
FIG. 14 depicts an exemplary embodiment in which the Front End and Storage Tier are provisioned partly in Data Processing Cloud(s) and partly On Premises, and the Processing Tier is provisioned in a Data Processing Cloud.
Figure 15:
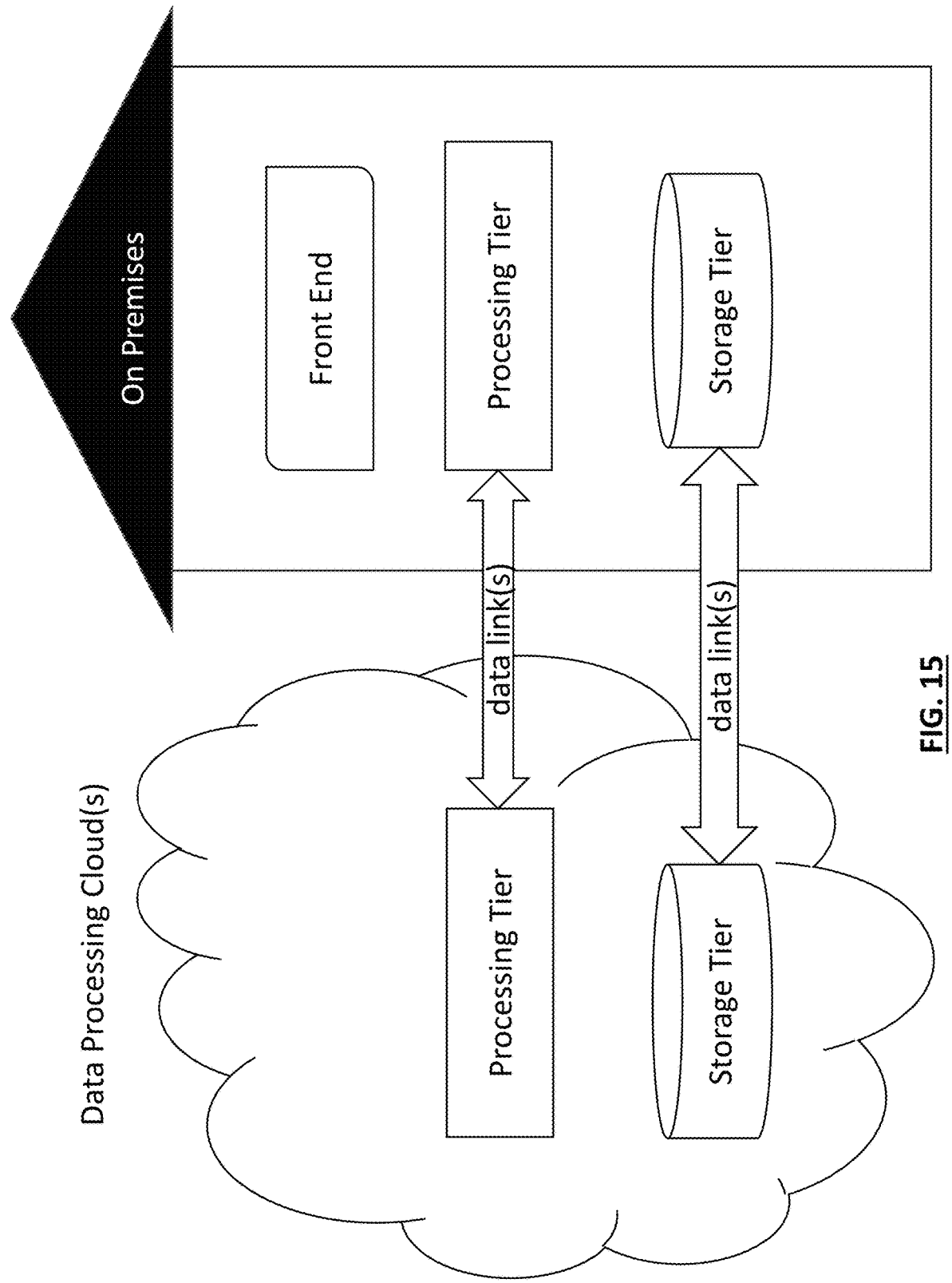
FIG. 15 depicts an exemplary embodiment in which the Processing and Storage Tiers are provisioned partly in Data Processing Cloud(s) and partly On Premises, and the Front End is provisioned On Premises.
Figure 16:
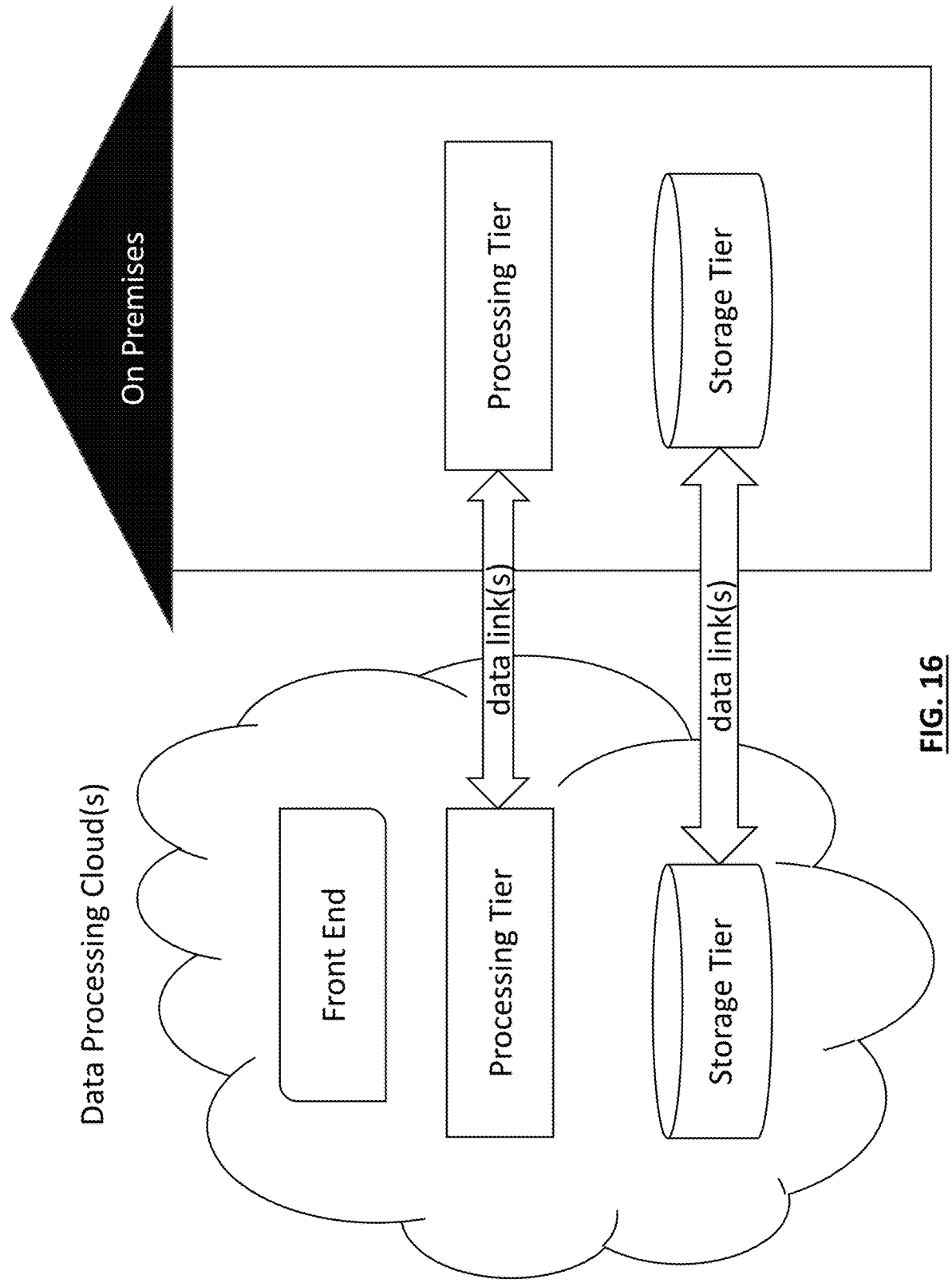
FIG. 16 depicts an exemplary embodiment in which the Processing and Storage Tiers are provisioned partly in Data Processing Cloud(s) and partly On Premises, and the Front End is provisioned in a Data Processing Cloud.
Figure 17:
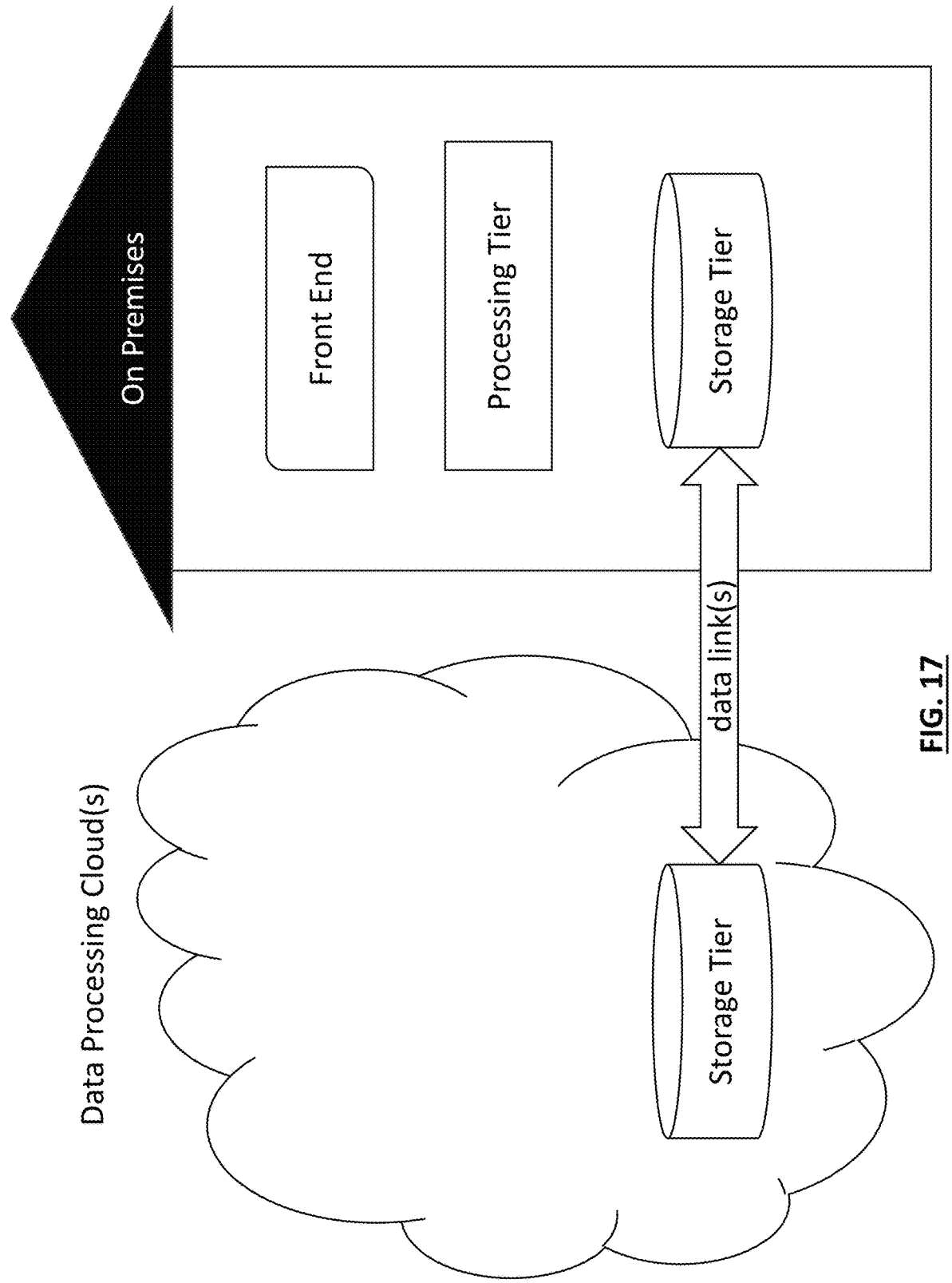
FIG. 17 depicts an exemplary embodiment in which the Storage Tier is provisioned partly in a Data Processing Cloud and partly On Premises, and the Front End and Processing Tier are provisioned On Premises.
Figure 18:
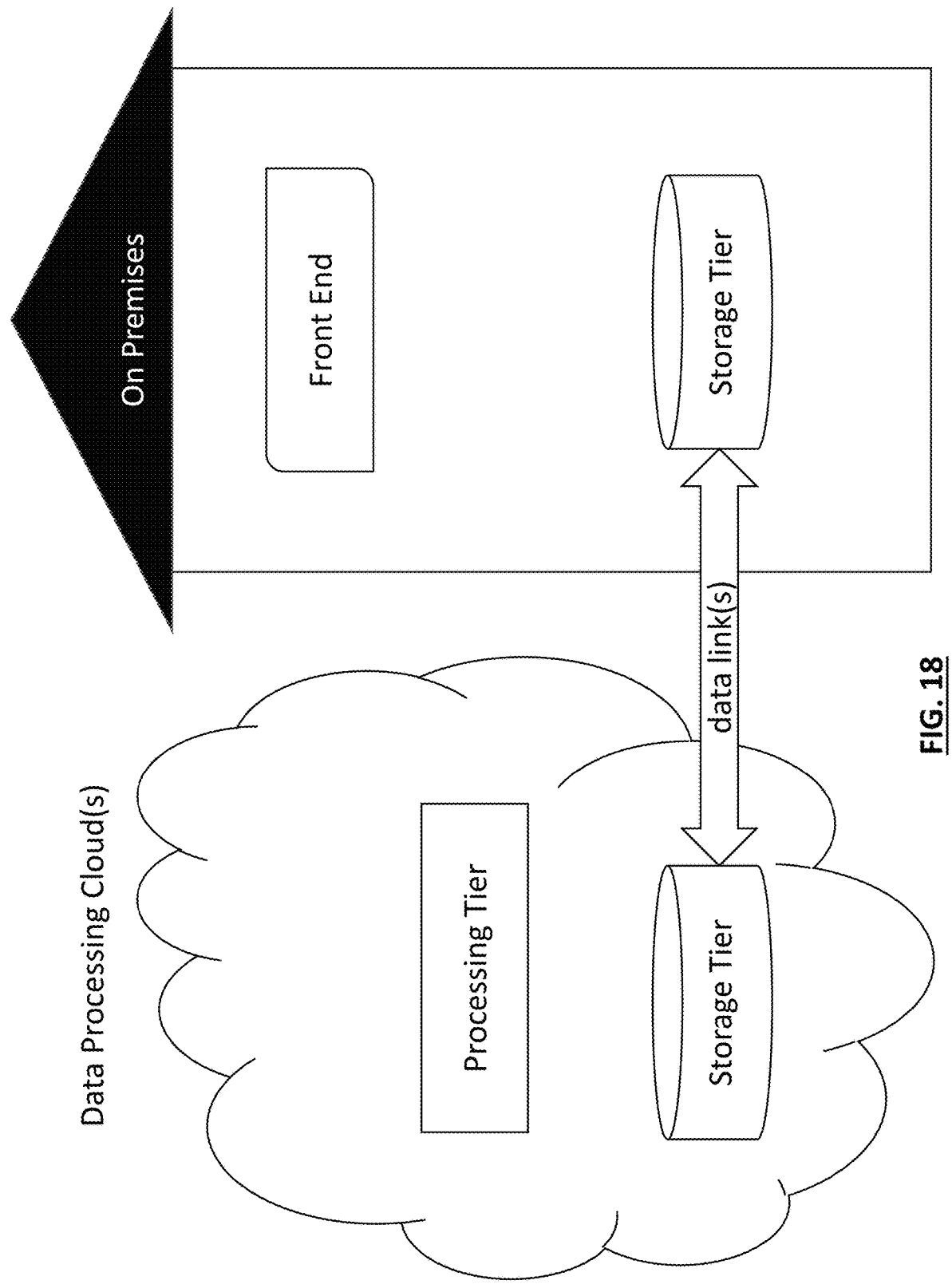
FIG. 18 depicts an exemplary embodiment in which the Storage Tier is provisioned partly in a Data Processing Cloud and partly On Premises, the Front End is provisioned On Premises, and the Processing Tier is provisioned in a Data Processing Cloud.
Figure 19:
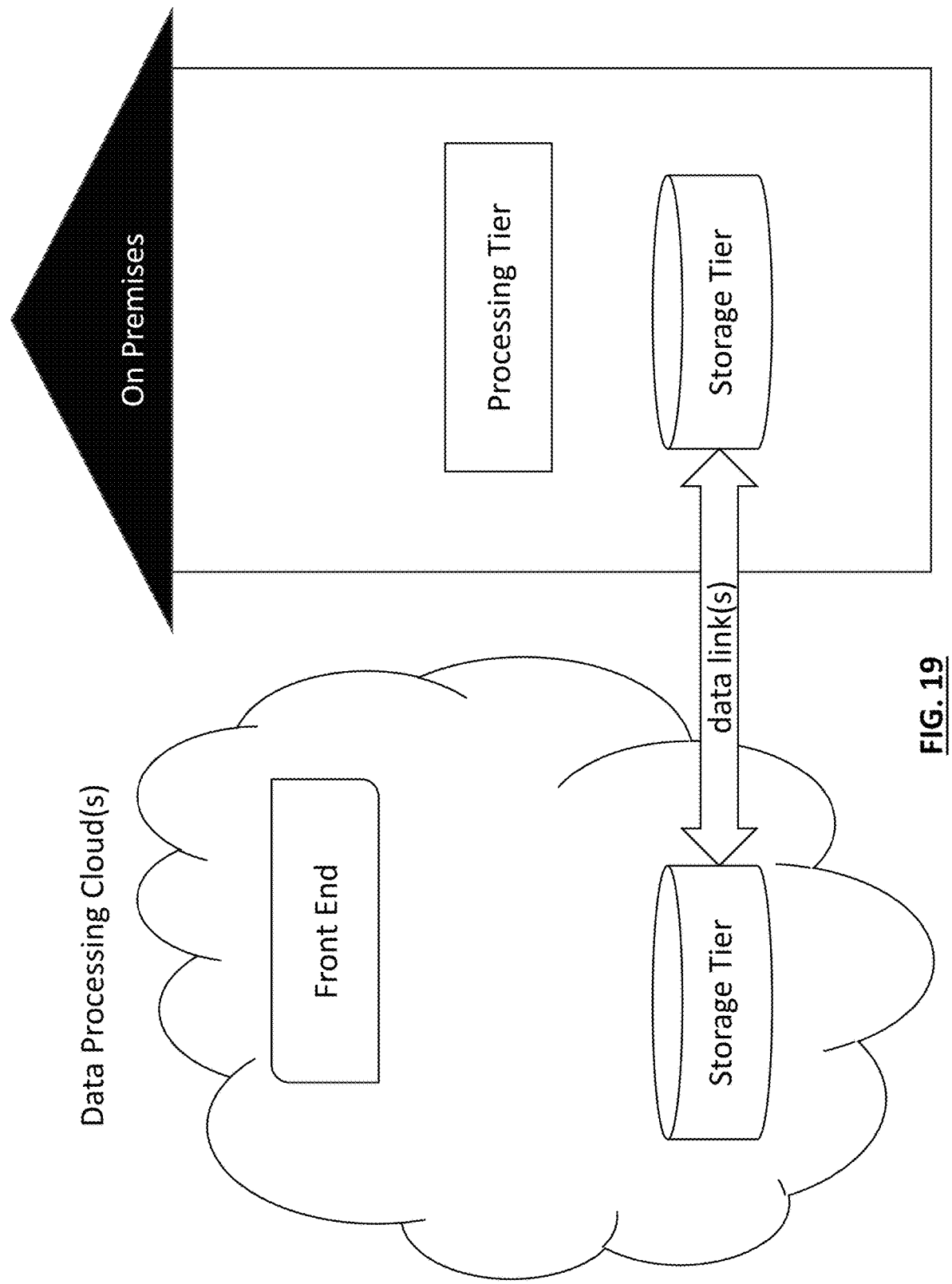
FIG. 19 depicts an exemplary embodiment in which the Storage Tier is provisioned partly in a Data Processing Cloud and partly On Premises, the Processing Tier is provisioned On Premises, and the Front End is provisioned in a Data Processing Cloud.
Figure 20:
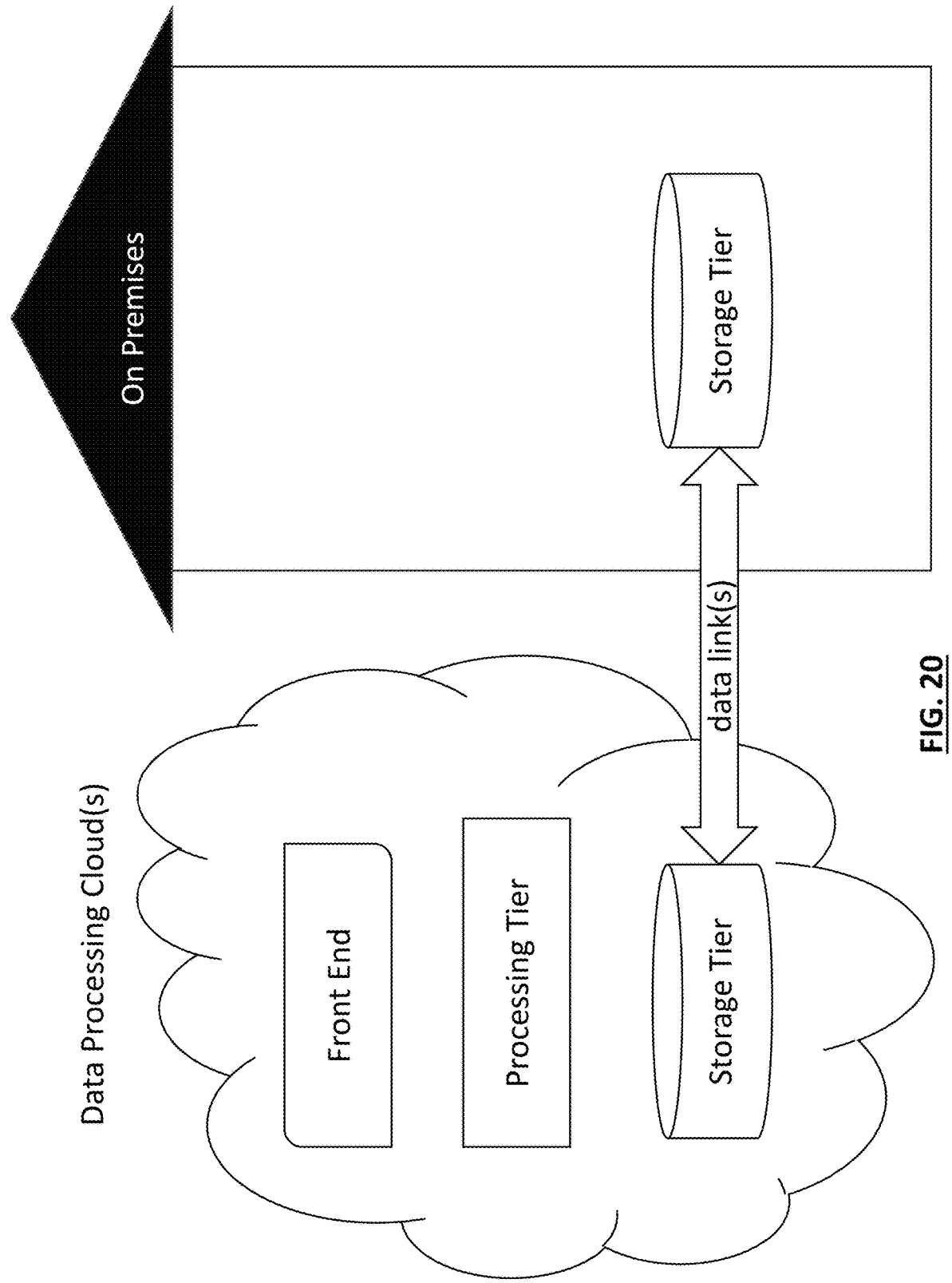
FIG. 20 depicts an exemplary embodiment in which the Storage Tier is provisioned partly in a Data Processing Cloud and partly On Premises, and the Front End and Processing Tier are provisioned in Data Processing Cloud(s)
Figure 21:
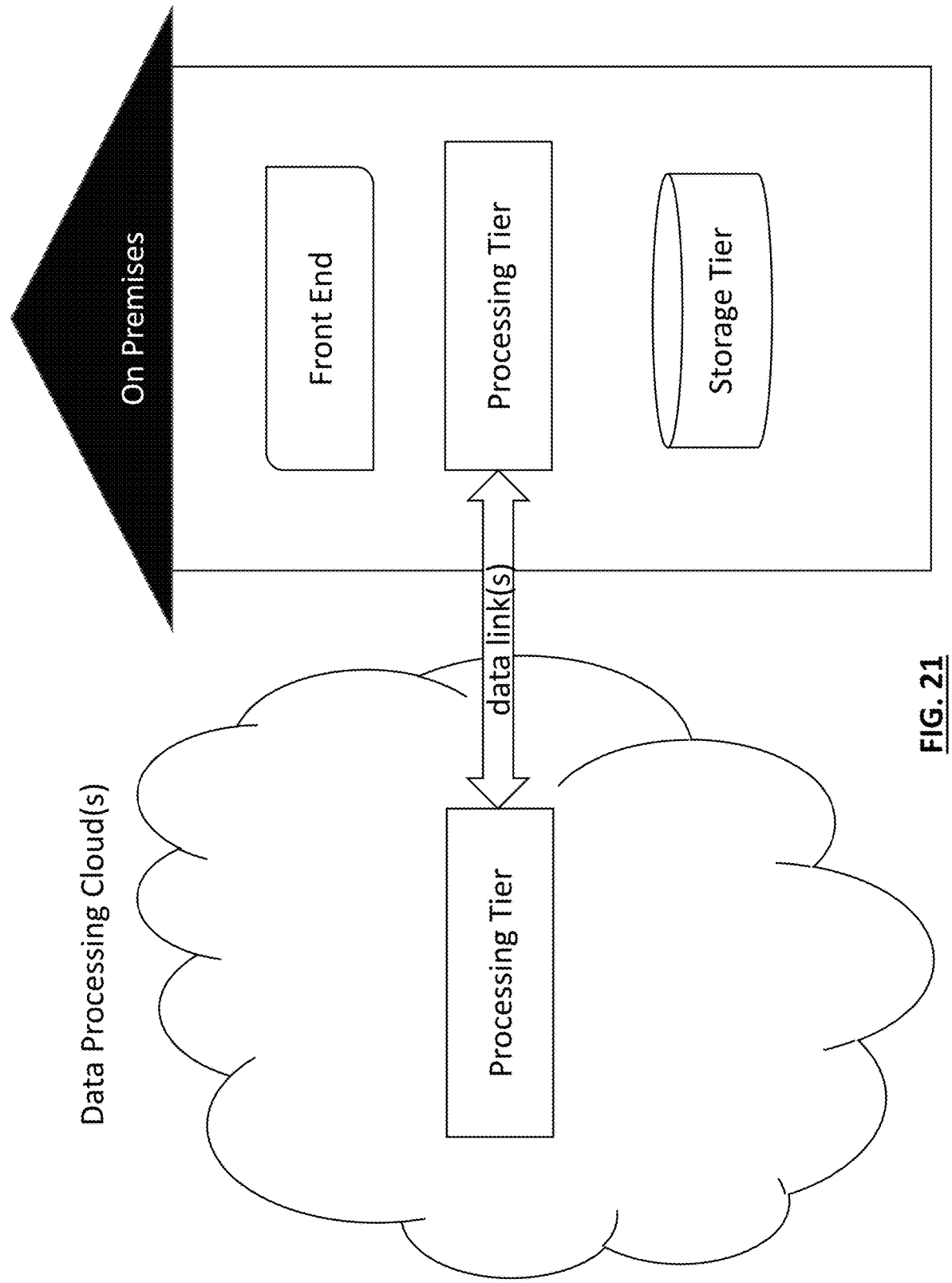
FIG. 21 depicts an exemplary embodiment in which the Processing Tier is provisioned partly in a Data Processing Cloud and partly On Premises, and the Front End and Storage Tier are provisioned On Premises.
Figure 22:
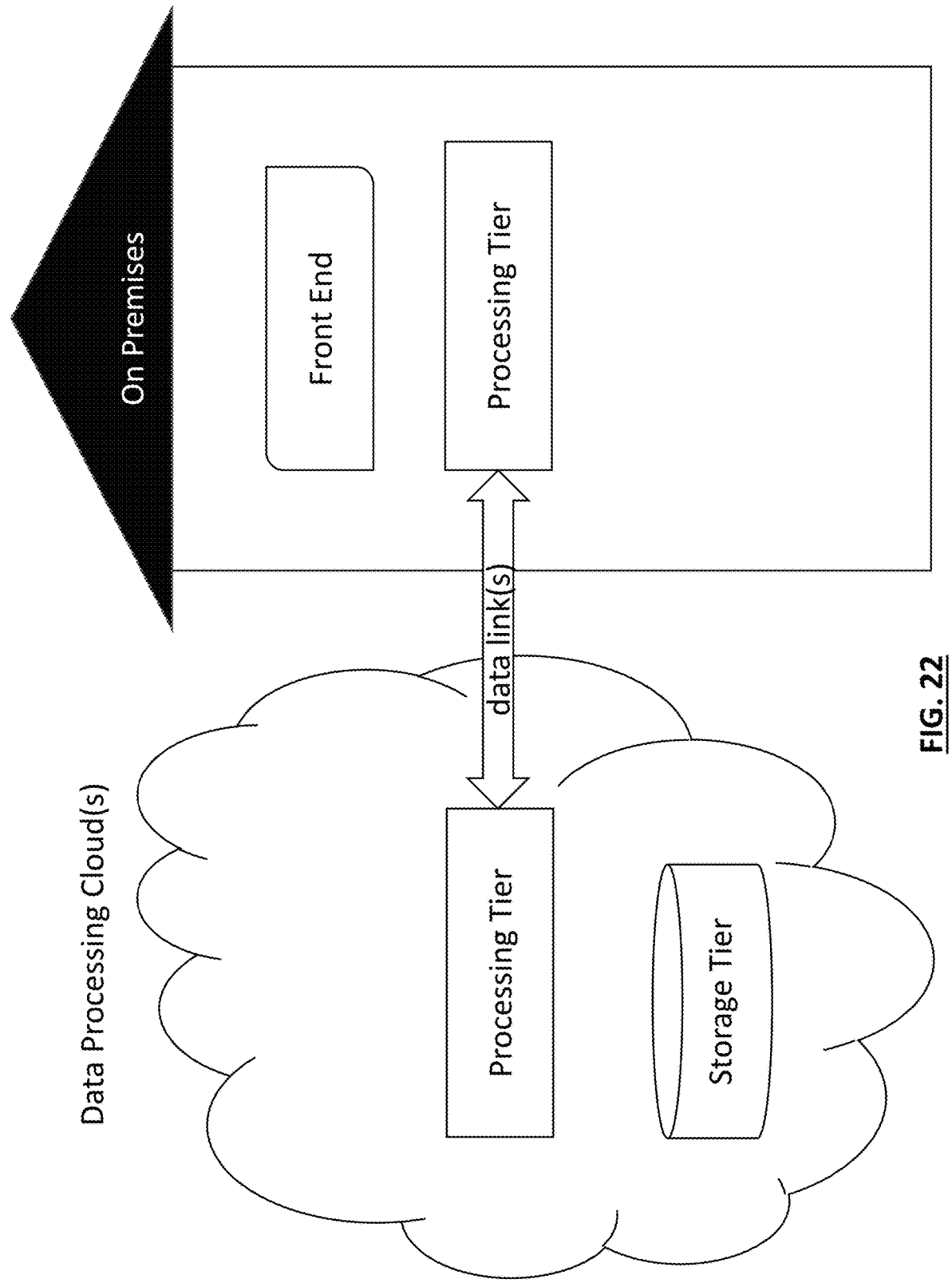
FIG. 22 depicts an exemplary embodiment in which the Processing Tier is provisioned partly in a Data Processing Cloud and partly On Premises, the Front End is provisioned On Premises, and the Storage Tier is provisioned in a Data Processing Cloud.
Figure 23:
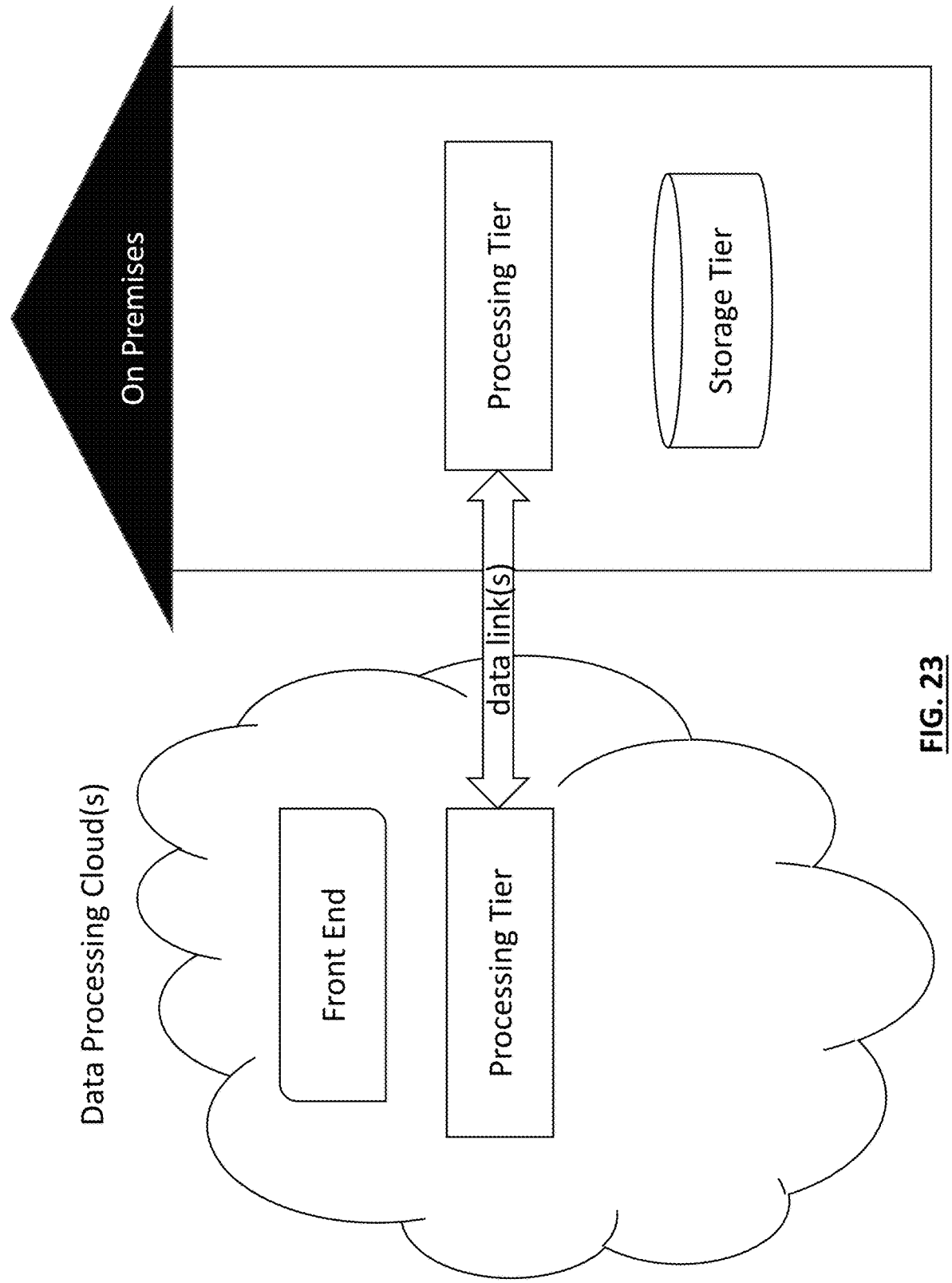
FIG. 23 depicts an exemplary embodiment in which the Processing Tier is provisioned partly in a Data Processing Cloud and partly On Premises, the Storage Tier is provisioned On Premises, and the Front End is provisioned in a Data Processing Cloud.
Figure 24:
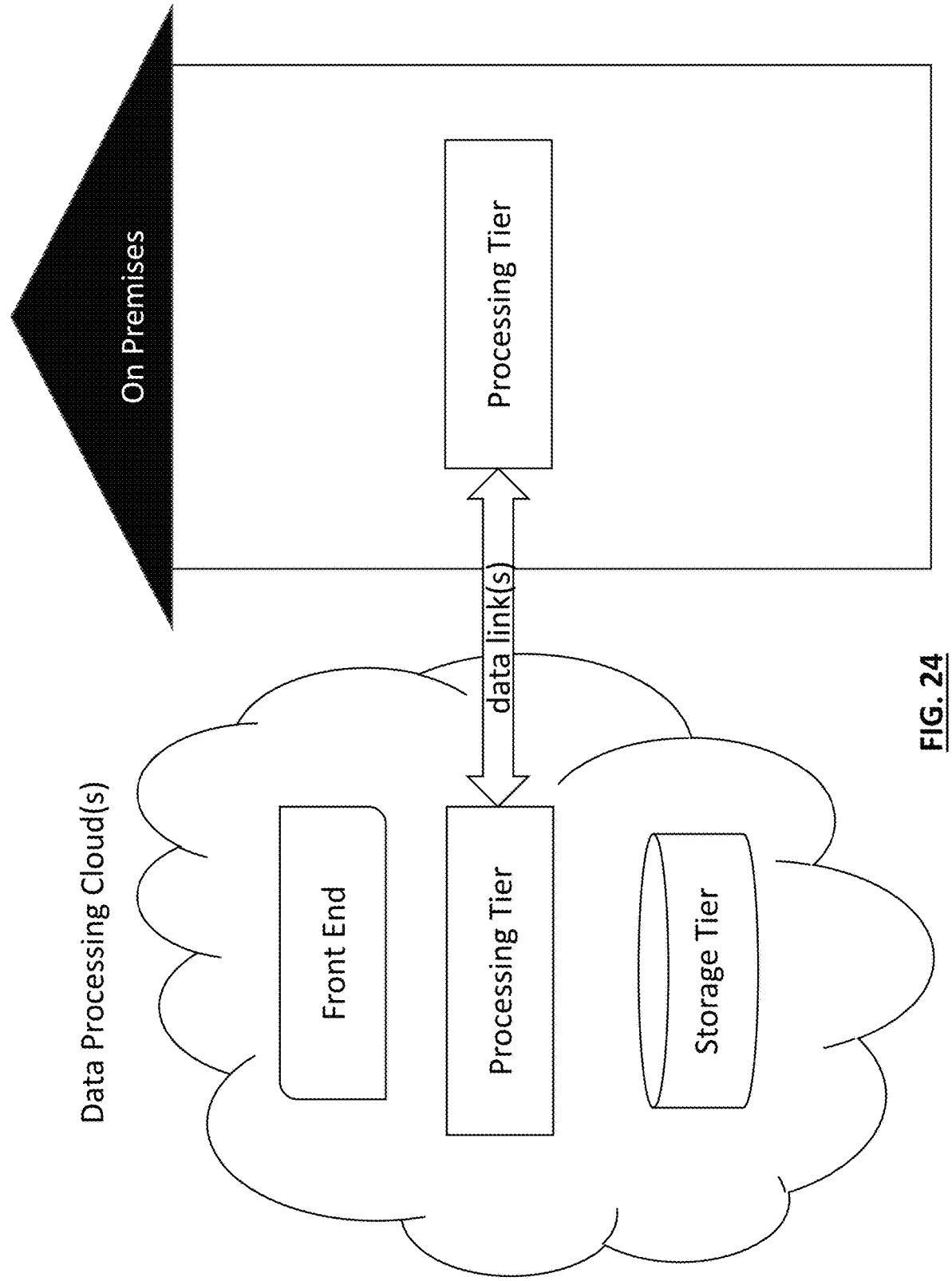
FIG. 24 depicts an exemplary embodiment in which the Processing Tier is provisioned partly in a Data Processing Cloud and partly On Premises, and the Front End and Storage Tier are provisioned in Data Processing Cloud(s)
Figure 25:
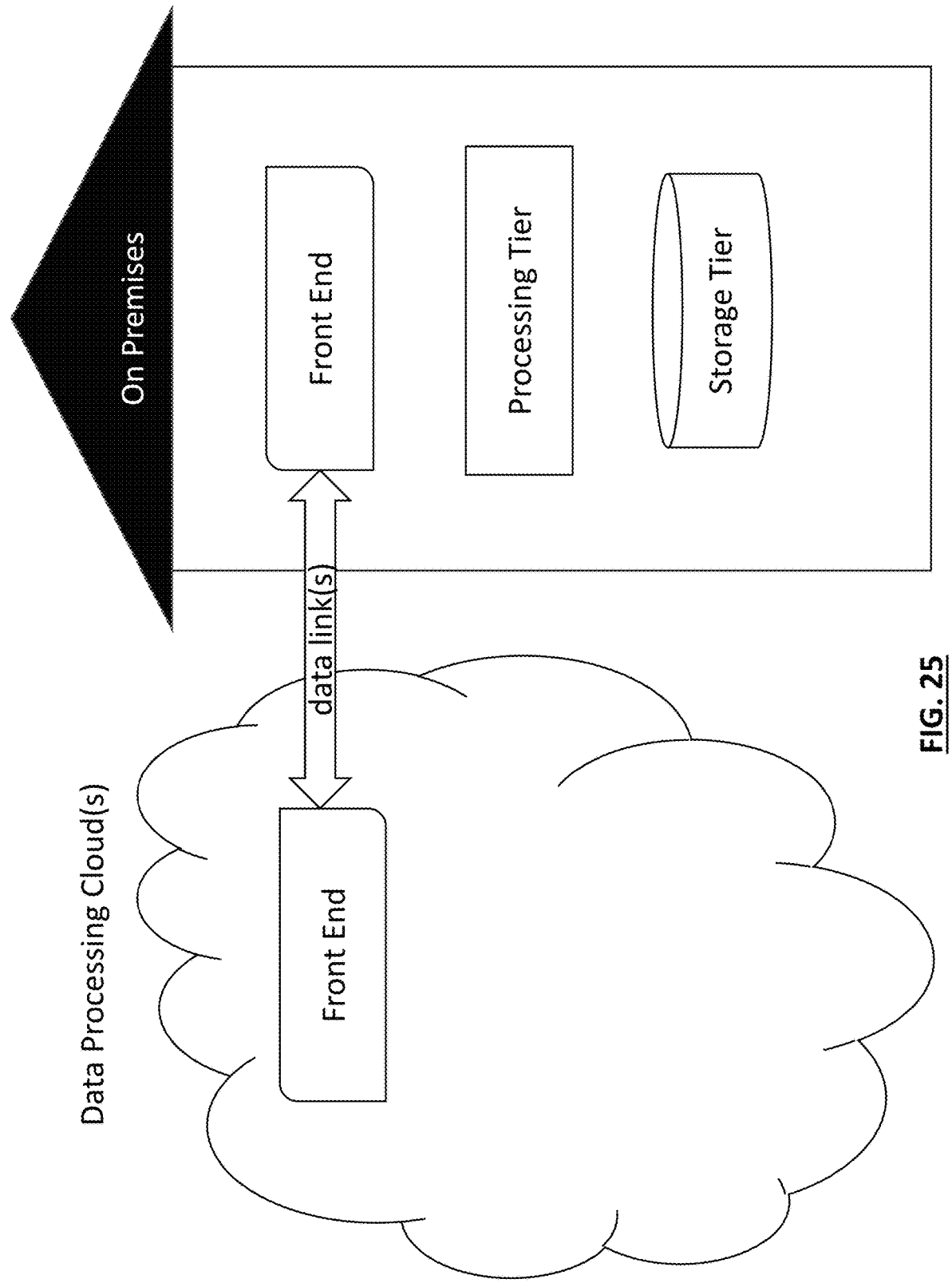
FIG. 25 depicts an exemplary embodiment in which the Front End is provisioned partly in a Data Processing Cloud and partly On Premises, and the Processing and Storage Tiers are provisioned On Premises.
Figure 26:
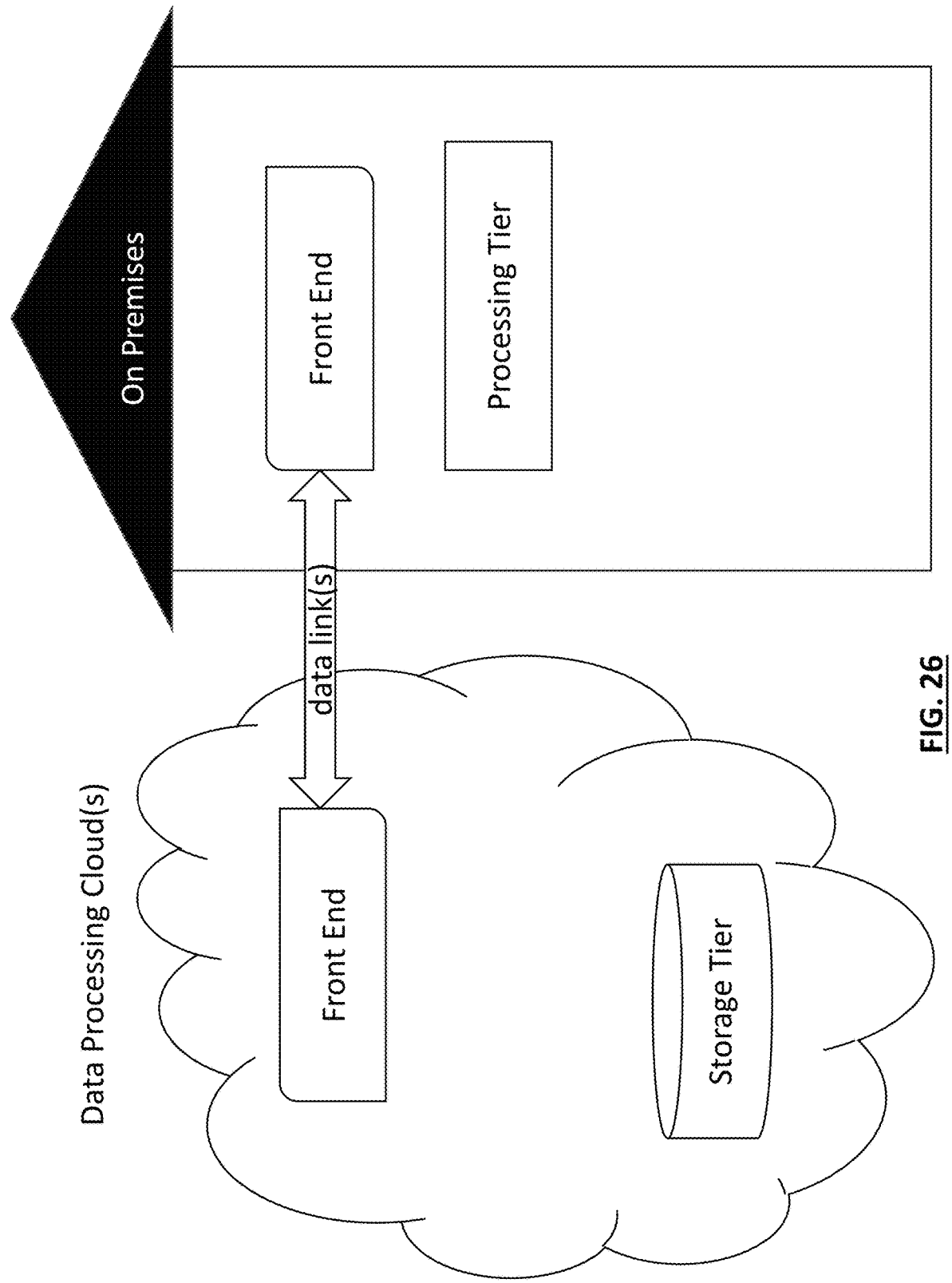
FIG. 26 depicts an exemplary embodiment in which the Front End is provisioned partly in a Data Processing Cloud and partly On Premises, the Processing Tier is provisioned On Premises, and the Storage Tier is provisioned in a Data Processing Cloud.
Figure 27:
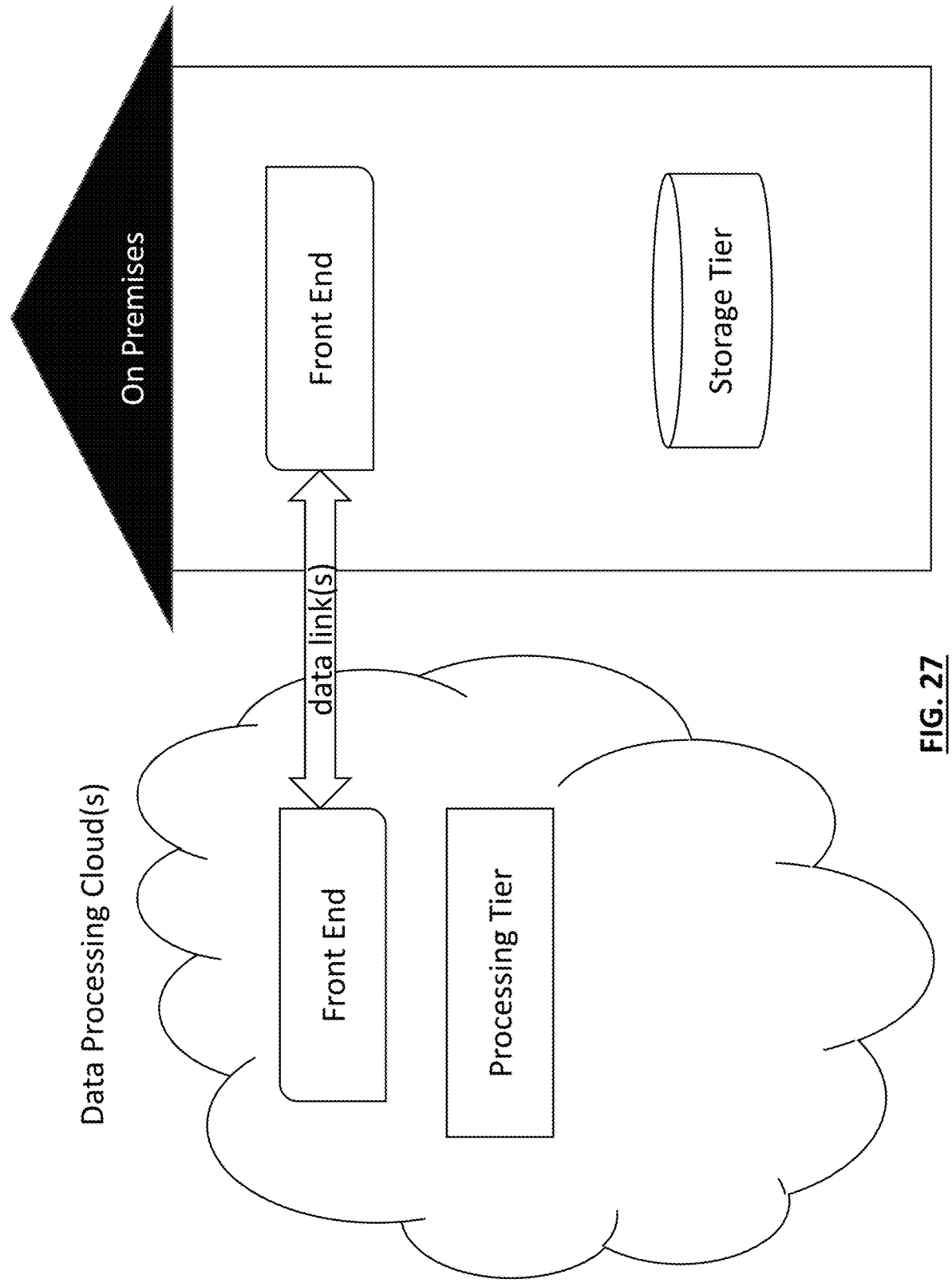
FIG. 27 depicts an exemplary embodiment in which the Front End is provisioned partly in a Data Processing Cloud and partly On Premises, the Storage Tier is provisioned On Premises, and the Processing Tier is provisioned in a Data Processing Cloud.
Figure 28:
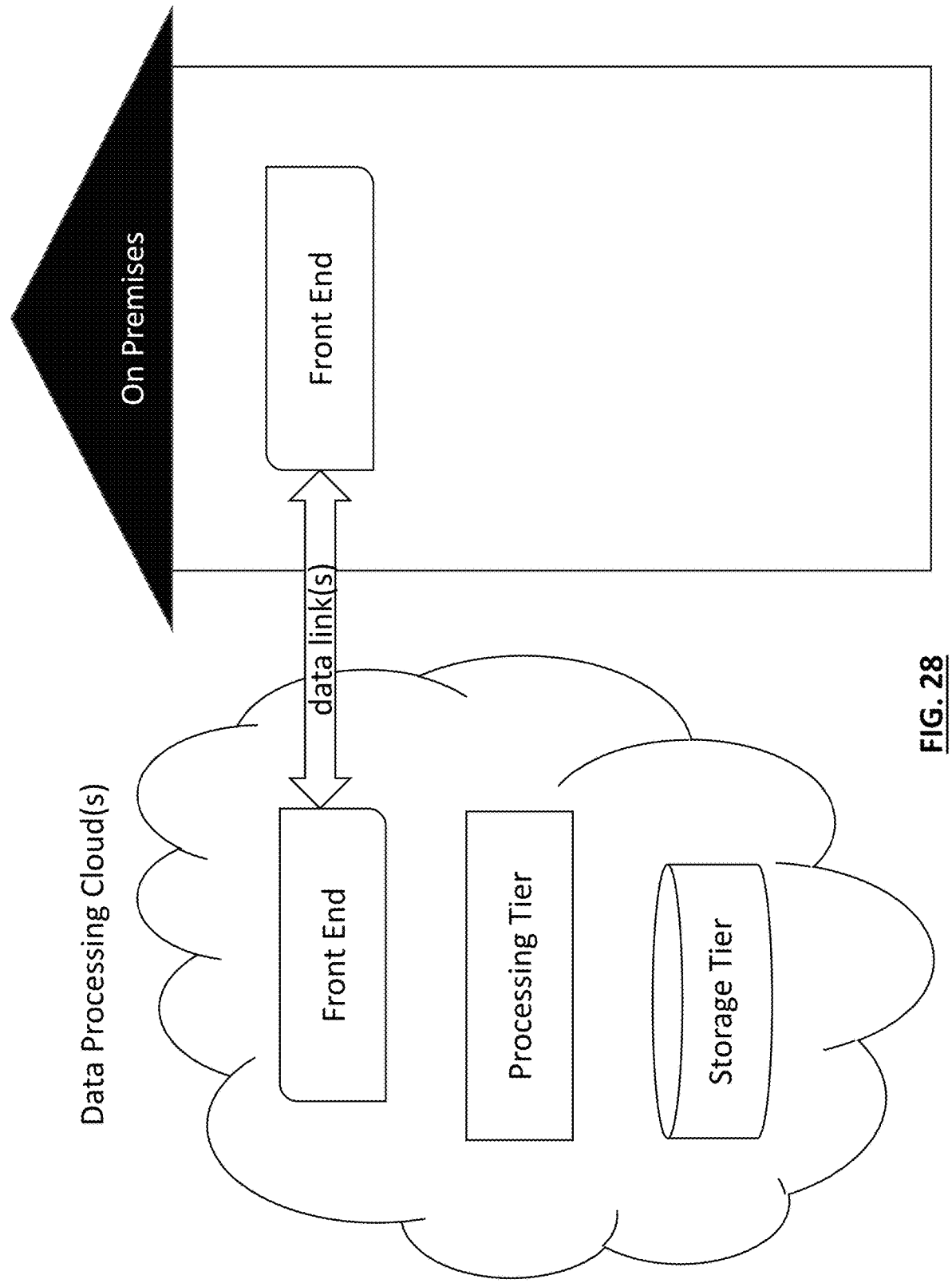
FIG. 28 depicts an exemplary embodiment in which the Front End is provisioned partly in a Data Processing Cloud and partly On Premises, and the Processing and Storage Tiers are provisioned in Data Processing Cloud(s)
Figure 29:
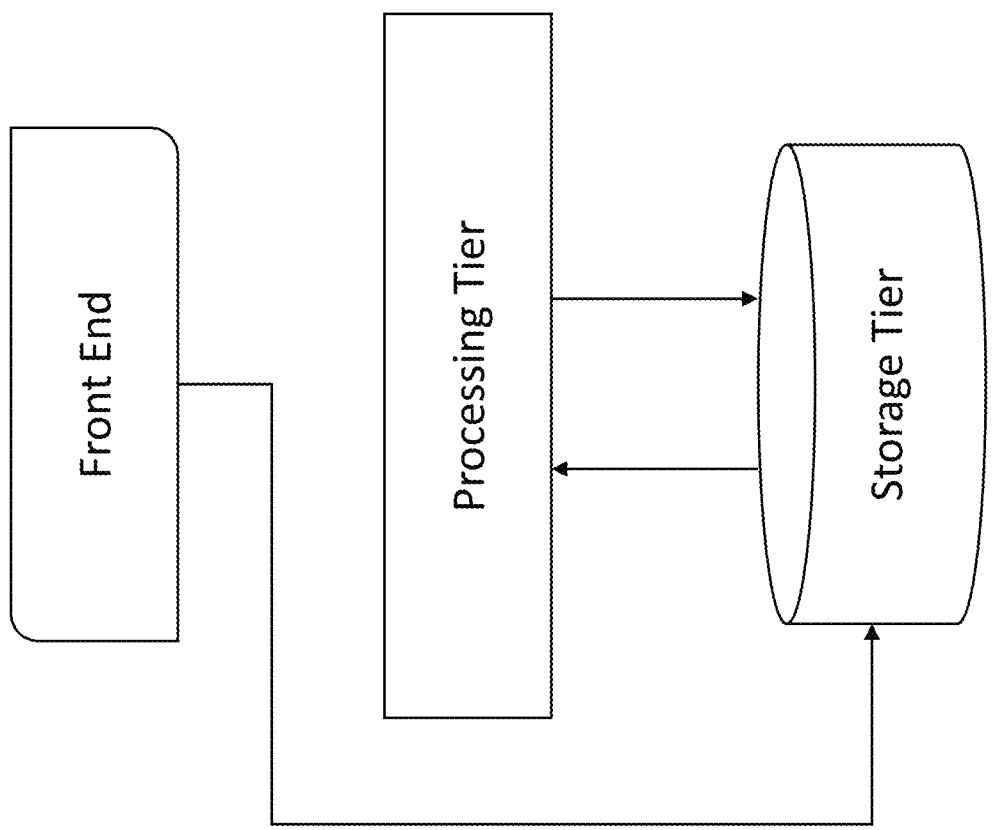
FIGS. 29-31 show three examples of possible data flows between the Front End, Processing Tier, and Storage Tier, in accordance with the various exemplary embodiments herein.
Figure 30:
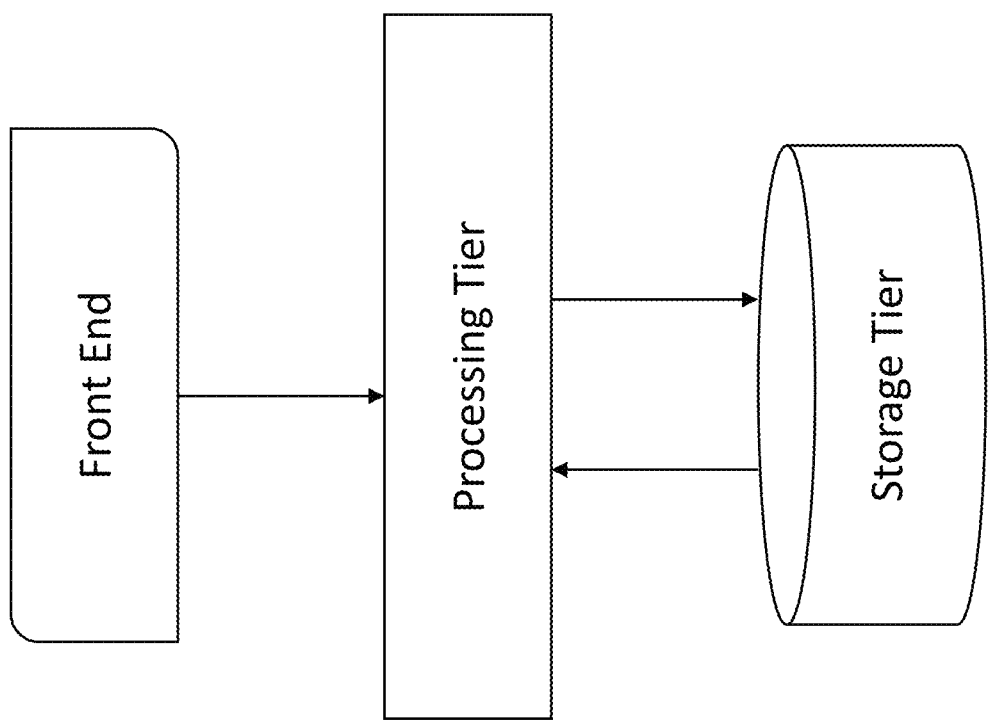
Figure 31:
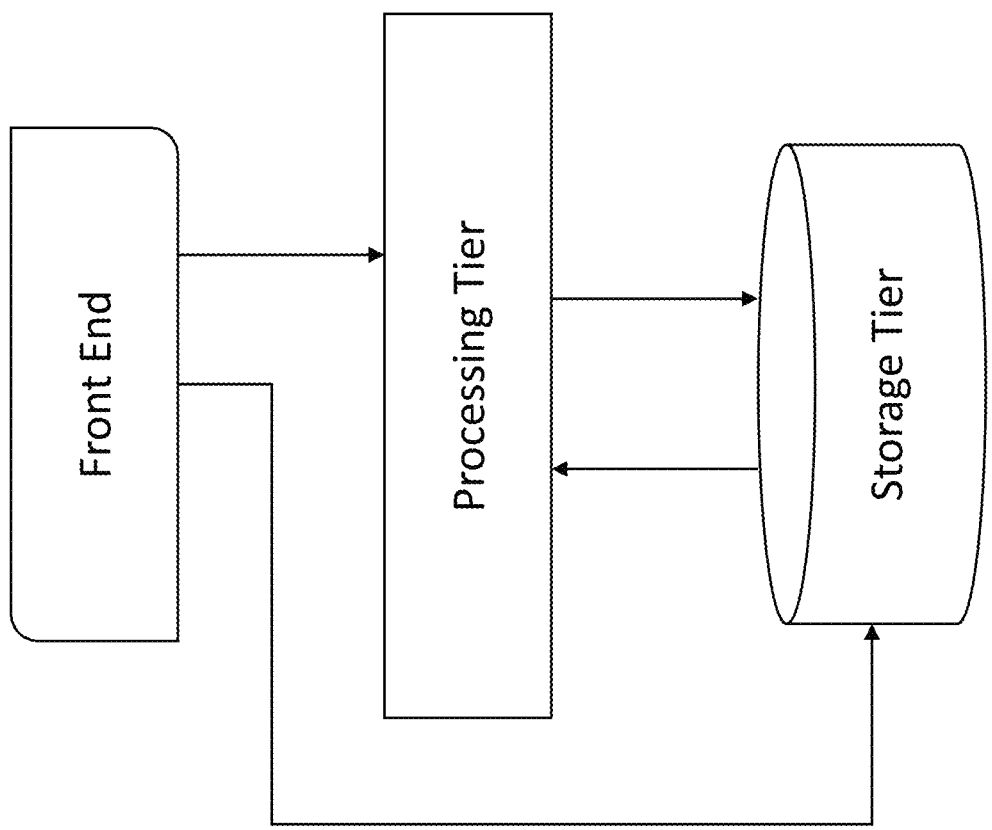

Reference is now made to FIGS. 29-31, which show three examples of possible data flows between the Front End, Processing Tier, and Storage Tier, in accordance with the various exemplary embodiments herein. While the arrows depict the directionality of "data" transfers (such as audio data, text, meta-data, etc.), it will be understood that there will or may exist additional signaling and control flows that may simultaneously operate in other directions or between other components. For example, in FIG. 29, data flow from the Front End to the Storage Tier is indicated as one way; however, those skilled in the art will appreciate that there will likely be some signaling channel or pathway that, for example, permits the Storage Tier to signal its readiness to receive data to the Front End.

FIG. 29 depicts an exemplary embodiment in which data is collected by or originates in the Front End, is then "sent" or "routed"—by, for example, a push protocol (see, e.g., https://en.wikipedia.org/wiki/Push_technology, incorporated by reference herein) or a pull/get protocol (see, e.g., https://en.wikipedia.org/wiki/Pull_technology, incorporated by reference herein)—to the Storage Tier. Data is then sent from the Storage Tier to the Processing Tier for processing, with the processed data sent back to the Storage Tier for storage/archiving. This embodiment also permits data that already exists in the Storage Tier, or is sent there through other network connections, to be routed to the Processing Tier for processing and sent back for storage/archiving.

FIG. 30 depicts an exemplary embodiment in which data is collected by or originates in the Front End, is then sent directly to the Processing Tier for processing, and then sent to the Storage Tier for storage/archiving. Such direct data transfer from the Front End to the Processing Tier reduces latency, which is important in the case of systems that have "real time" monitoring or alerting aspects. This embodiment also permits data that already exists in the Storage Tier, or is sent there through other network connections, to be routed to the Processing Tier for processing and sent back for storage/archiving. Additionally, though not depicted in FIG. 30, "real time" systems may interact directly with the Processing Tier to receive processed data without the additional latency associated with the Storage Tier. (A preferred form of "real time" data acquisition utilizes the assignee's direct-to-transcript technology, as disclosed in co-pending U.S. patent application Ser. No. 16/371,011, "On-The-Fly Transcription/Redaction Of Voice-Over-IP Calls," filed Mar. 31, 2019, incorporated by reference herein.)

FIG. 31 depicts a "hybrid" embodiment, in which data is collected by or originates in the Front End, some or all of which may be then sent directly to the Processing Tier for processing, then sent to the Storage Tier for storage/archiving, and some or all of which may also be sent to the Storage Tier, from which it is then sent to the Processing Tier for processing, with the processed data sent back to the Storage Tier for storage/archiving. This permits use of the direct data routing approach for "real time" audio feeds, and lower cost "batch mode" processing for other data feeds, which can be processed during time(s) when power and cloud resources are cheaper, for example.

Figure 32:
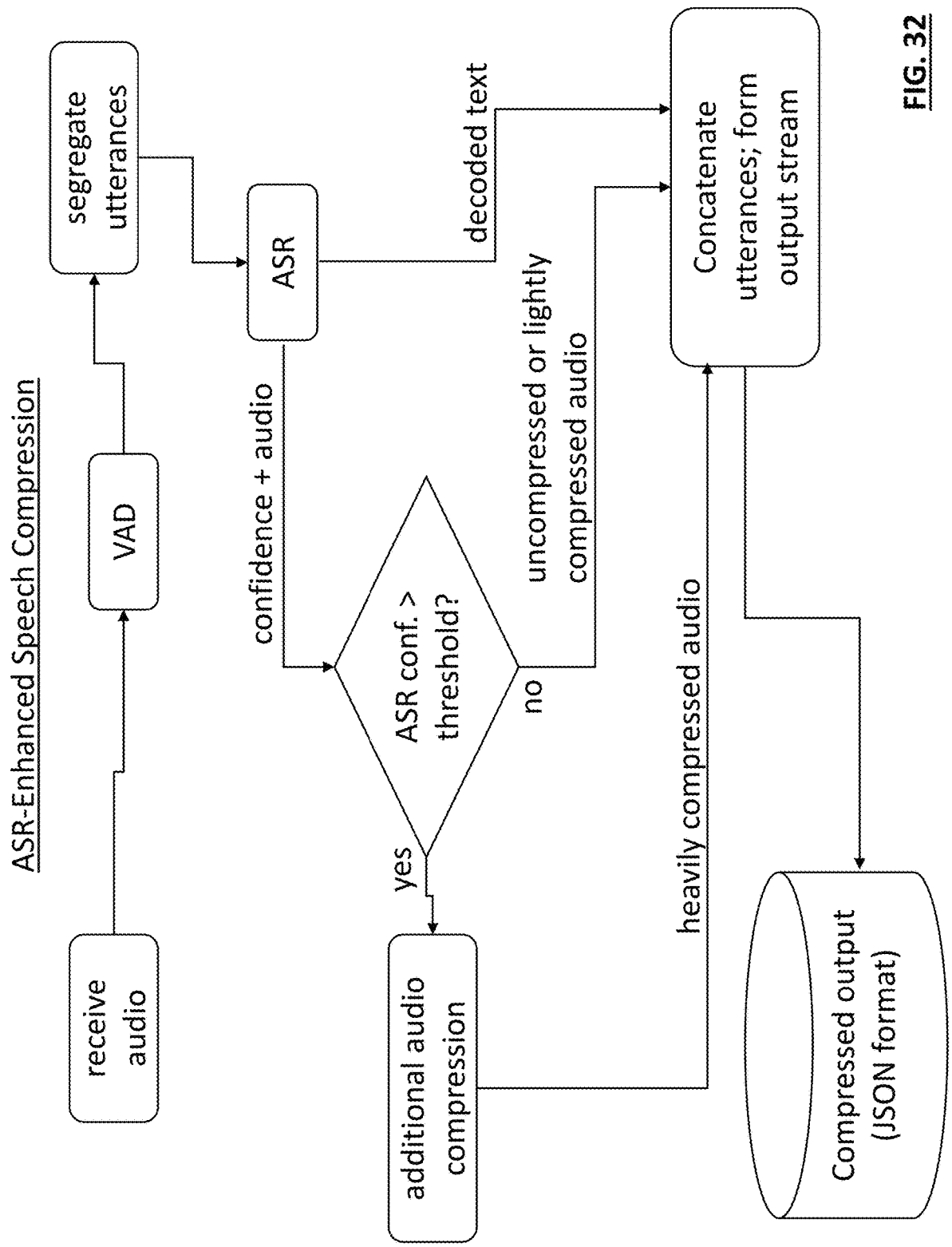
FIG. 32 depicts a first ASR-enhanced speech compression flow, in accordance with some of the exemplary embodiments herein.
Figure 33:
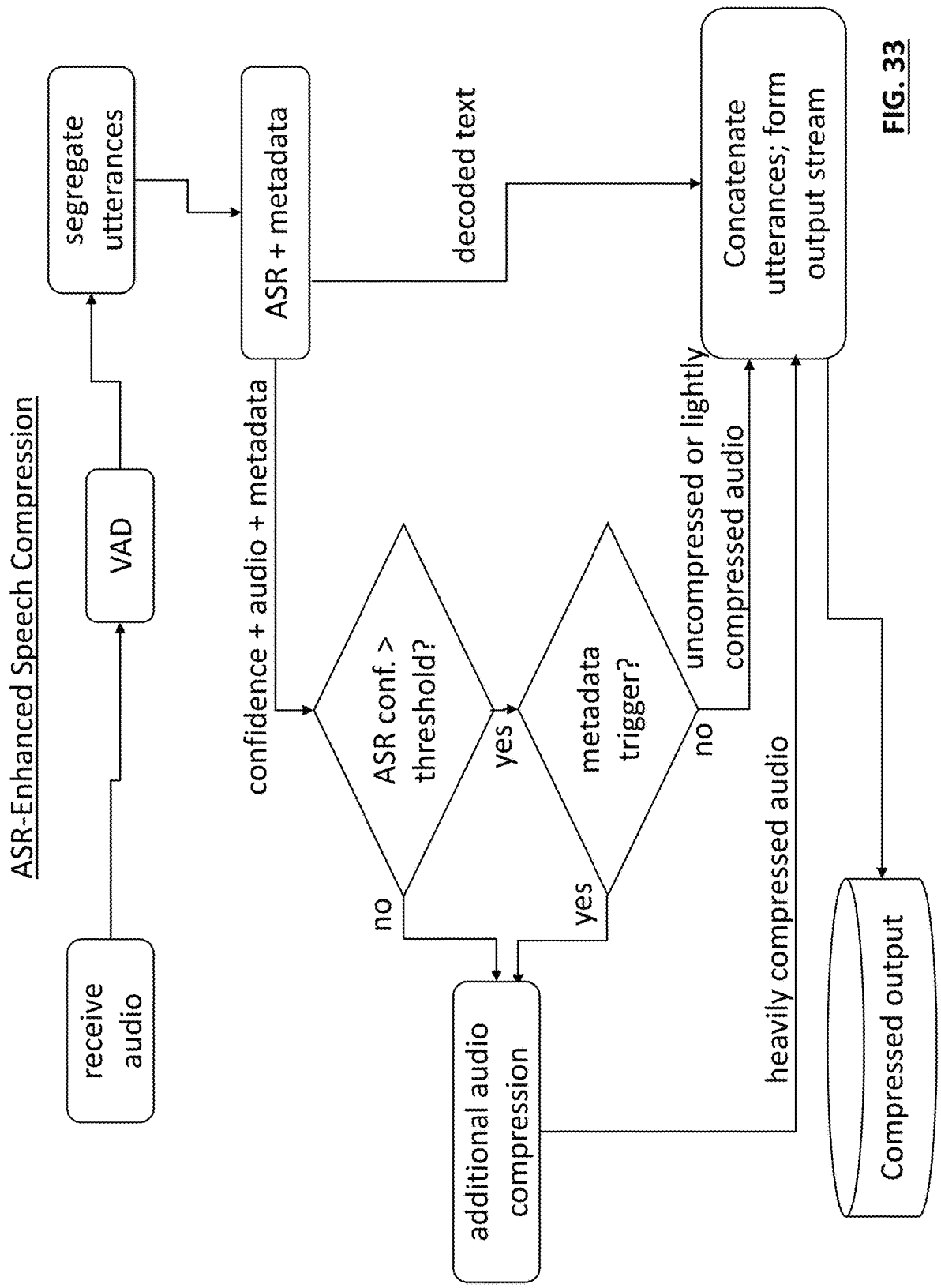
FIG. 33 depicts a second ASR-enhanced speech compression flow, in accordance with another of the exemplary embodiments herein.
Figure 34:
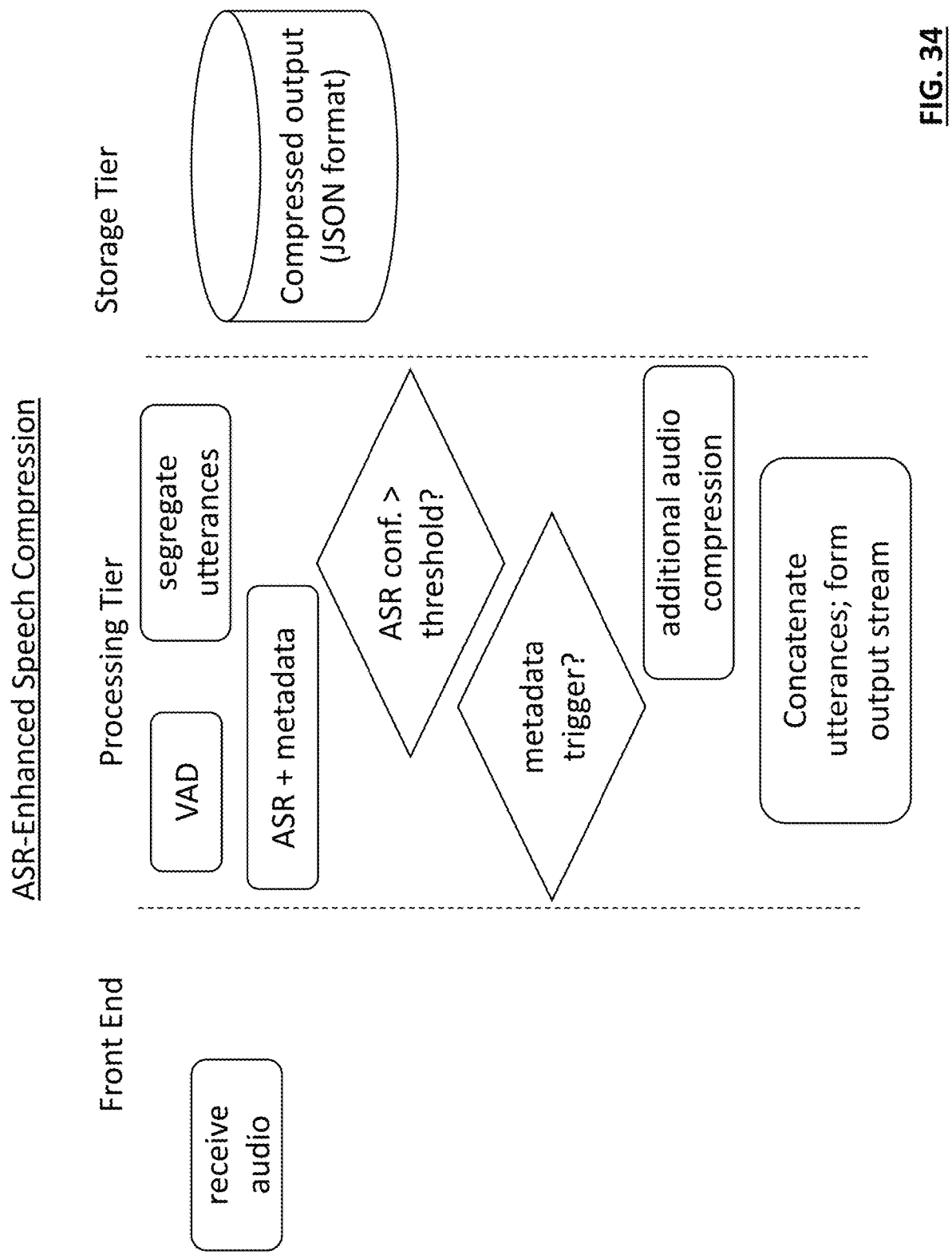
FIG. 34 depicts a first exemplary assignment of the ASR-enhanced speech compression flow elements (of FIGS. 32-33) between the Front End, Processing, and Storage Tiers, in accordance with certain exemplary embodiments herein.
Figure 35:
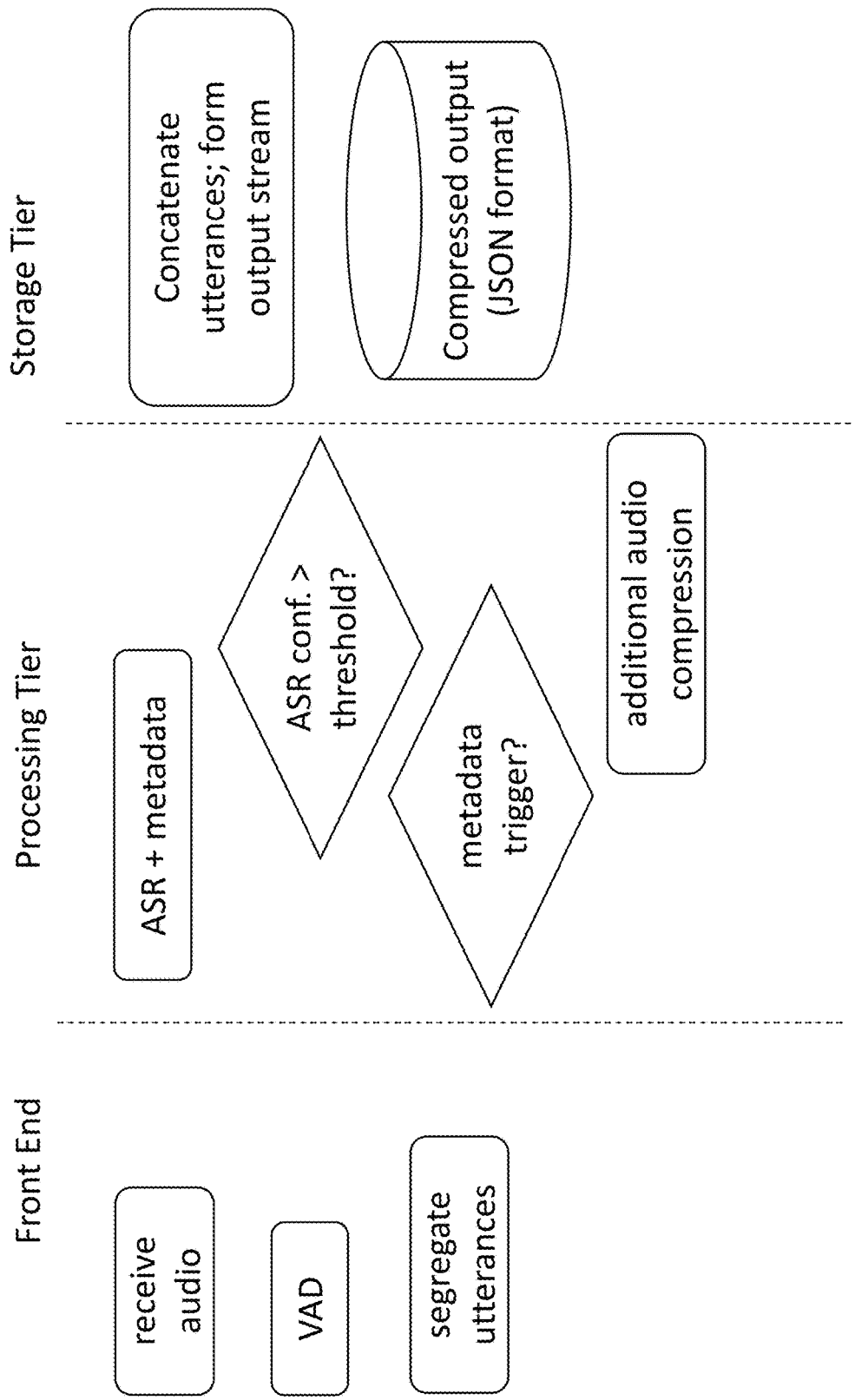
FIG. 35 depicts a second exemplary assignment of the ASR-enhanced speech compression flow elements (of FIGS. 32-33) between the Front End, Processing, and Storage Tiers, in accordance with certain exemplary embodiments herein.
Figure 36:
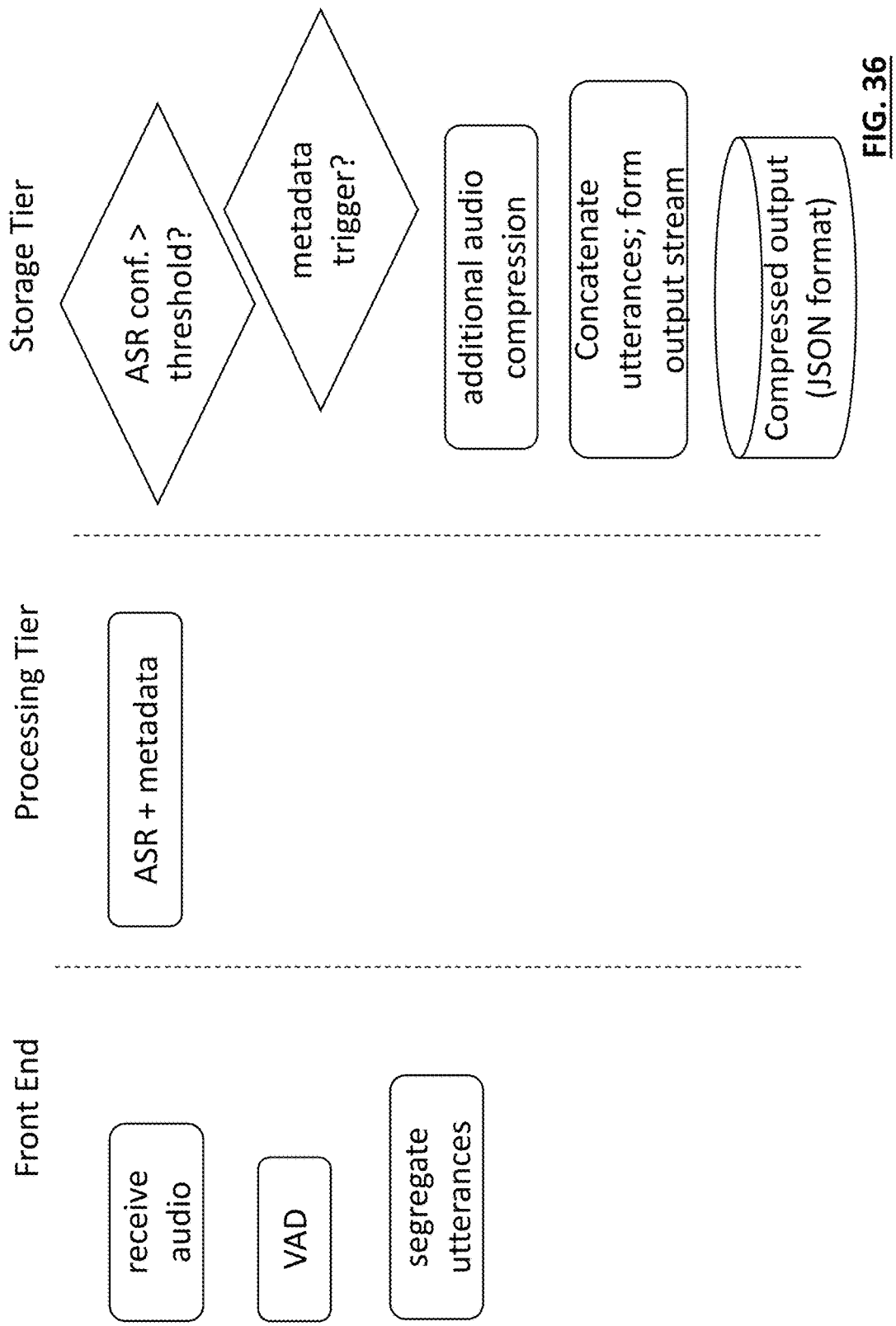
FIG. 36 depicts a third exemplary assignment of the ASR-enhanced speech compression flow elements (of FIGS. 32-33) between the Front End, Processing, and Storage Tiers, in accordance with certain exemplary embodiments herein; and, FIG. 37 depicts a fourth exemplary assignment of the ASR-enhanced speech compression flow elements (of FIGS. 32-33) between the Front End, Processing, and Storage Tiers, in accordance with certain exemplary embodiments herein.
Figure 37:
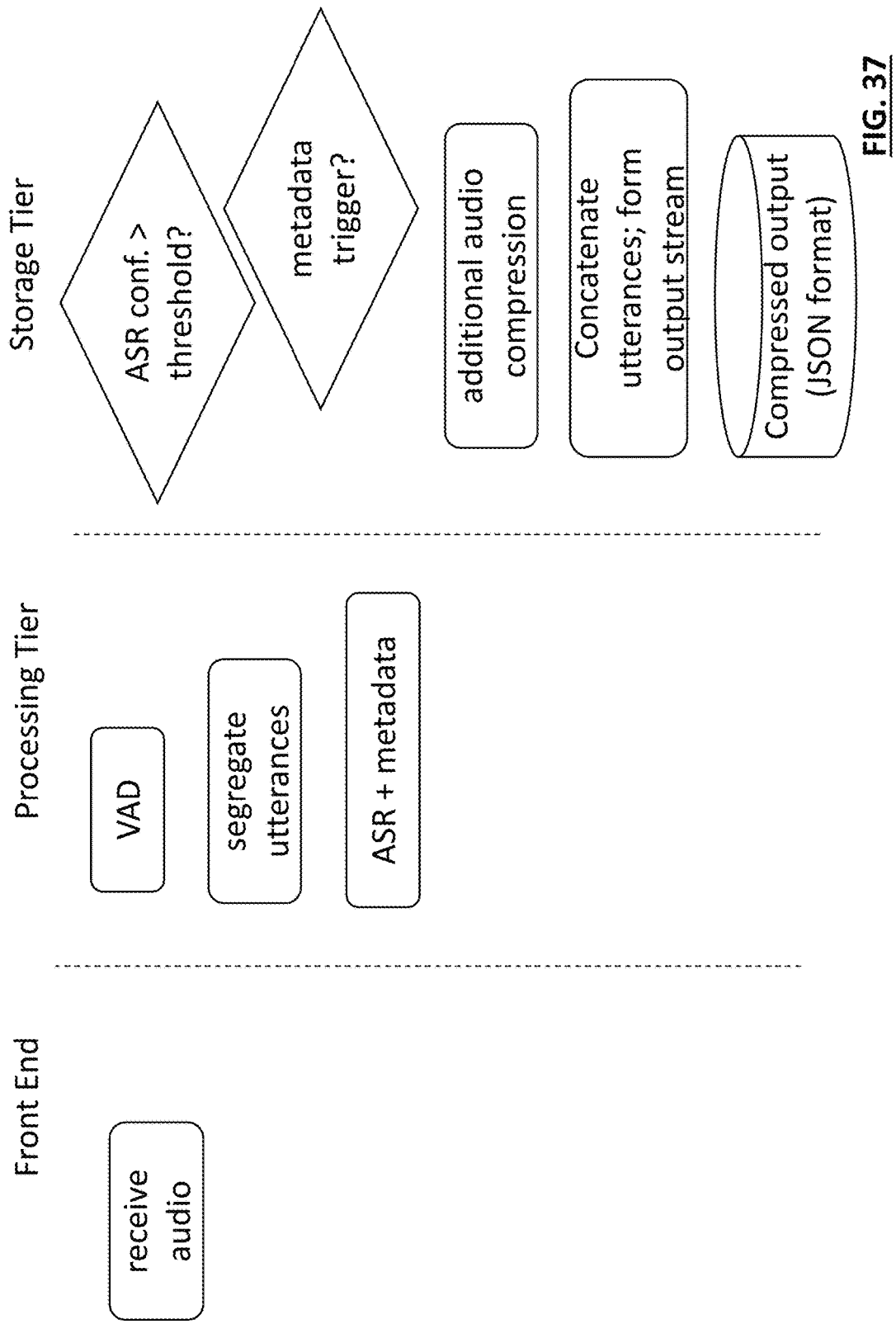

Referring now to FIGS. 32-33, which depict exemplary flow diagrams for improved speech compression flows that employ ASR confidence (and/or other metadata) to determine whether to additionally compress the audio speech signal, further detail regarding the depicted elements is as follows:

Receive audio: Audio may be received or obtained from any source, whether a "live" feed (such as CTI, VOIP tap, PBX) or a recorded source (such as on-prem storage, cloud storage, or a combination thereof). A preferred source utilizes the assignee's DtT technology, as described in the commonly owned, co-pending application Ser. No. 16/371,011.

VAD: Voice activity detection is an optional step. Its main function is to eliminate dead space, to improve utilization efficiency of more compute-intensive resources, such as the ASR engine, or of storage resources. VAD algorithms are well known in the art. See https://en.wikipedia.org/wiki/Voice_activity_detection (incorporated by reference herein).

Segregate: Segregation of the speech input into words or utterances (preferred) is performed as an initial step to ASR decoding. Though depicted as a distinct step, it may be performed as part of the VAD or ASR processes.

Confidence: Confidence may be determined either by the ASR engine (preferred) or using a separate confidence classifier. The confidence classifier may operate from the same input stream as the ASR, or may utilize both the input and output of the ASR in its computation.

Low ASR confidence: If ASR confidence dips below a "threshold" value, then the word, phrase, or utterance in question will be passed uncompressed (or only slightly compressed) to the output stream. In some embodiments, the "threshold" is preset; whereas in other embodiments, it may vary dynamically, based for example on the moving average of confidence values being seen by the system.

FIGS. 34-37 depict how these functions/modules can be assigned amongst the Front End, Processing Tier, and Storage Tier, in accordance with the invention herein. These, however, are merely illustrative, and not meant to be in any way limiting. Furthermore, FIGS. 2-28 illustrate how the Front End, Processing Tier, and Storage Tier functions may be provisioned in cloud(s), on premises, or in embodiments that bridge the on-prem/cloud boundary with secure data links.

What I claim in this application is:

1. A computer-implemented process for digitally compressing an audio signal that includes human speech utterances, the process comprising at least the following computer-implemented acts:
   (1) receiving a digitally encoded audio signal that includes human speech utterances in a first, uncompressed format;
   (2) identifying portions of the digitally encoded audio signal that correspond to speech utterances and, for each speech utterance, forming a corresponding uncompressed audio utterance;
   (3) performing automatic speech recognition (ASR) processing to produce, for each speech utterance, at least a corresponding (i) text representation and (ii) ASR confidence that represents a likelihood that the text representation accurately captures all spoken words contained in its corresponding uncompressed audio utterance;
   (4) for each speech utterance, if its ASR confidence exceeds a predetermined threshold value, then forming a corresponding compressed audio utterance in a highly compressed format;
   (5) forming an output stream that includes, for each speech utterance, at least:
       (i) its corresponding text representation;
       (ii) its corresponding ASR confidence; and
       (iii) either (a) its corresponding uncompressed audio utterance or (b) its corresponding compressed audio utterance, but not both (a) and (b), wherein the output stream contains (a) if the utterance's corresponding ASR confidence is less than or equal to the predetermined threshold value and (b) if the utterance's corresponding ASR confidence exceeds the predetermined threshold value.

2. A process, as defined in claim 1, wherein for each speech utterance, the output stream further includes metadata computed from the corresponding uncompressed audio utterance.

3. A process, as defined in claim 1, wherein the metadata includes one or more of: identity of the speaker, gender, approximate age, and/or emotion.

4. A process, as defined in claim 1, wherein the ASR confidence values are derived from normalized likelihood scores.

5. A process, as defined in claim 1, wherein the ASR confidence values are computed using an N-best homogeneity analysis.

6. A process, as defined in claim 1, wherein the ASR confidence values are computed using an acoustic stability analysis.

7. A process, as defined in claim 1, wherein the ASR confidence values are computed using a word graph hypothesis density analysis.

8. A process, as defined in claim 1, wherein the ASR confidence values are derived from associated state, phoneme, or word durations.

9. A process, as defined in claim 1, wherein the ASR confidence values are derived from language model (LM) scores or LM back-off behaviors.

10. A process, as defined in claim 1, wherein the ASR confidence values are computed using a posterior probability analysis.

11. A process, as defined in claim 1, wherein the ASR confidence values are computed using a log-likelihood-ratio analysis.

12. A process, as defined in claim 1, wherein the ASR confidence values are computed using a neural net that includes word identity and aggregated words as predictors.

13. A computer-implemented process for digitally compressing an audio signal that includes human speech utterances, the process comprising at least the following computer-implemented acts:
  (1) receiving a digitally encoded audio signal that includes human speech utterances in a first, lightly compressed format;
  (2) identifying portions of the digitally encoded audio signal that correspond to speech utterances and, for each speech utterance, forming a corresponding lightly compressed audio utterance;
  (3) performing automatic speech recognition (ASR) processing to produce, for each speech utterance, at least a corresponding (i) text representation and (ii) ASR confidence that represents a likelihood that the text representation accurately captures all spoken words contained in its corresponding lightly compressed audio utterance;
  (4) for each speech utterance, if its ASR confidence exceeds a predetermined threshold value, then forming a corresponding heavily compressed audio utterance in a highly compressed format;
  (5) forming an output stream that includes, for each speech utterance, at least:
    (i) its corresponding text representation;
    (ii) its corresponding ASR confidence; and
    (iii) either (a) its corresponding lightly compressed audio utterance or (b) its corresponding heavily compressed audio utterance, but not both (a) and (b), wherein the output stream contains (a) if the utterance's corresponding ASR confidence is less than or equal to the predetermined threshold value and (b) if the utterance's corresponding ASR confidence exceeds the predetermined threshold value.

14. A computer-implemented process for digitally compressing an audio signal that includes human speech utterances, the process comprising at least the following computer-implemented acts:
  (1) receiving a digitally encoded audio signal that includes human speech utterances in a first, lightly compressed format;
  (2) identifying portions of the digitally encoded audio signal that correspond to speech utterances and, for each speech utterance, forming a corresponding lightly compressed audio utterance;
  (3) performing automatic speech recognition (ASR) processing to produce, for each speech utterance, at least a corresponding (i) text representation and (ii) ASR confidence that represents a likelihood that the text representation accurately captures all spoken words contained in its corresponding lightly compressed audio utterance;
  (4) for each speech utterance, if its ASR confidence exceeds a predetermined threshold value, then forming a corresponding heavily compressed audio utterance in a highly compressed format;
  (5) forming an output stream that, for each speech utterance, consists essentially of:
    (i) its corresponding text representation;
    (ii) its corresponding ASR confidence; and
    (iii) either (a) its corresponding lightly compressed audio utterance or (b) its corresponding heavily compressed audio utterance, but not both (a) and (b), wherein the output stream contains (a) if the utterance's corresponding ASR confidence is less than or equal to the predetermined threshold value and (b) if the utterance's corresponding ASR confidence exceeds the predetermined threshold value.

15. A process, as defined in claim 1, wherein for each speech utterance, the output stream further consists essentially of metadata computed from the corresponding lightly compressed audio utterance.

16. A process, as defined in claim 1, wherein the metadata includes one or more of: identity of the speaker, gender, approximate age, and/or emotion.

* * * * *